US012658926B2

(12) United States Patent
Wang

(10) Patent No.: US 12,658,926 B2
(45) Date of Patent: Jun. 16, 2026

(54) SYSTEMS HAVING A PHASE FREQUENCY DETECTOR

(71) Applicant: Micron Technology, Inc., Boise, ID (US)

(72) Inventor: Junjun Wang, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 283 days.

(21) Appl. No.: 18/284,805

(22) PCT Filed: May 6, 2021

(86) PCT No.: PCT/CN2021/091871
§ 371 (c)(1),
(2) Date: Sep. 28, 2023

(87) PCT Pub. No.: WO2022/232982
PCT Pub. Date: Nov. 10, 2022

(65) Prior Publication Data
US 2024/0187003 A1    Jun. 6, 2024

(51) Int. Cl.
*H03L 7/089*    (2006.01)
*H03L 7/099*    (2006.01)
*H03L 7/183*    (2006.01)

(52) U.S. Cl.
CPC ............ *H03L 7/089* (2013.01); *H03L 7/0991* (2013.01); *H03L 7/183* (2013.01)

(58) Field of Classification Search
CPC ........ H03L 7/089; H03L 7/0991; H03L 7/183
See application file for complete search history.

(56) References Cited

U.S. PATENT DOCUMENTS 4,122,405 A * 10/1978 Tietz ...................... H03L 7/095
331/25
5,142,555 A * 8/1992 Whiteside ............... H03L 7/087
375/328
(Continued)

FOREIGN PATENT DOCUMENTS

CN        1614892 A      5/2005
CN      102273077 A     12/2011
(Continued)

OTHER PUBLICATIONS

"International Application Serial No. PCT CN2021 091871, International Preliminary Report on Patentability mailed Nov. 16, 2023", 5 pages.
(Continued)

*Primary Examiner* — Adam D Houston
(74) *Attorney, Agent, or Firm* — Schwegman Lundberg & Woessner, P.A.

(57)    ABSTRACT
A variety of applications can include a phase frequency detector structured to track the falling edges of two input signals to detect a phase difference between the two signals and to generate one or more signals that can be used to adjust one of the signals with respect to the other when the phase difference is greater than 180 degrees. The phase frequency detector can be implemented in a phase lock loop circuit to track the falling edges of a reference clock signal and the falling edge of a feedback signal. In response to detection of the phase difference between the reference clock signal and the feedback signal being greater than 180 degrees using the falling edges of these signals, the phase frequency detector can adjust its output signals to provide for recovery of a lock condition for the reference clock signal. Additional devices, systems, and methods are discussed.

20 Claims, 12 Drawing Sheets

(56)                References Cited

U.S. PATENT DOCUMENTS

| | | | | |
|---|---|---|---|---|
| 5,539,345 | A * | 7/1996 | Hawkins | G06F 11/1679 |
| | | | | 331/25 |
| 5,744,983 | A * | 4/1998 | Bazes | H03D 13/004 |
| | | | | 327/12 |
| 6,058,152 | A * | 5/2000 | Tanishima | H04L 7/033 |
| | | | | 327/1 |
| 6,636,079 | B2 * | 10/2003 | Koyama | H03L 7/18 |
| | | | | 327/148 |
| 8,766,684 | B2 * | 7/2014 | Hsueh | H03L 7/093 |
| | | | | 327/148 |
| 9,548,748 | B1 * | 1/2017 | Luo | H03L 7/085 |
| 10,530,563 | B2 * | 1/2020 | Cesar | H03L 7/0807 |
| 10,715,155 | B1 | 7/2020 | Parvizi et al. | |
| 11,303,284 | B1 * | 4/2022 | Sahu | H03L 7/0891 |
| 11,595,047 | B1 * | 2/2023 | Park | H03L 7/0891 |
| 12,316,334 | B2 * | 5/2025 | Pothireddy | H03L 7/095 |
| 2003/0071668 | A1 | 4/2003 | Starr | |
| 2004/0061539 | A1 * | 4/2004 | Joordens | H03K 5/1252 |
| | | | | 327/165 |
| 2007/0170959 | A1 * | 7/2007 | Minzoni | H03L 7/089 |
| | | | | 327/112 |
| 2010/0061499 | A1 * | 3/2010 | Mijuskovic | H03D 13/004 |
| | | | | 375/375 |
| 2010/0134157 | A1 | 6/2010 | Kawashima | |
| 2011/0140747 | A1 * | 6/2011 | Endo | H03L 7/103 |
| | | | | 327/156 |
| 2012/0187989 | A1 * | 7/2012 | Barnes | H03L 7/093 |
| | | | | 327/157 |
| 2013/0099836 | A1 * | 4/2013 | Shaeffer | H03L 7/0893 |
| | | | | 327/147 |
| 2016/0112055 | A1 * | 4/2016 | Mirajkar | H03L 7/1077 |
| | | | | 327/158 |
| 2019/0180797 | A1 * | 6/2019 | Kim | G11C 7/1066 |
| 2023/0006681 | A1 * | 1/2023 | Ghotgalkar | H03L 7/0891 |
| 2023/0170911 | A1 * | 6/2023 | Ergun | H03L 7/1974 |
| | | | | 375/316 |
| 2024/0088904 | A1 * | 3/2024 | Roberts | H03L 7/091 |
| 2024/0187003 | A1 * | 6/2024 | Wang | H03L 7/0991 |

FOREIGN PATENT DOCUMENTS

| | | | | |
|---|---|---|---|---|
| CN | 103684436 A | 3/2014 | | |
| CN | 106209080 A | 12/2016 | | |
| CN | 111697967 A | 9/2020 | | |
| EP | 0665650 A1 * | 8/1995 | | H03L 7/089 |
| JP | 7720390 B2 * | 8/2025 | | H03L 7/091 |
| WO | WO-2022232982 A1 | 11/2022 | | |

OTHER PUBLICATIONS

"International Application Serial No. PCT/CN2021/091871, International Search Report mailed Jan. 30, 2022", 4 pgs.
"International Application Serial No. PCT/CN2021/091871, Written Opinion mailed Jan. 30, 2022", 4 pgs.

* cited by examiner

Figure 1:
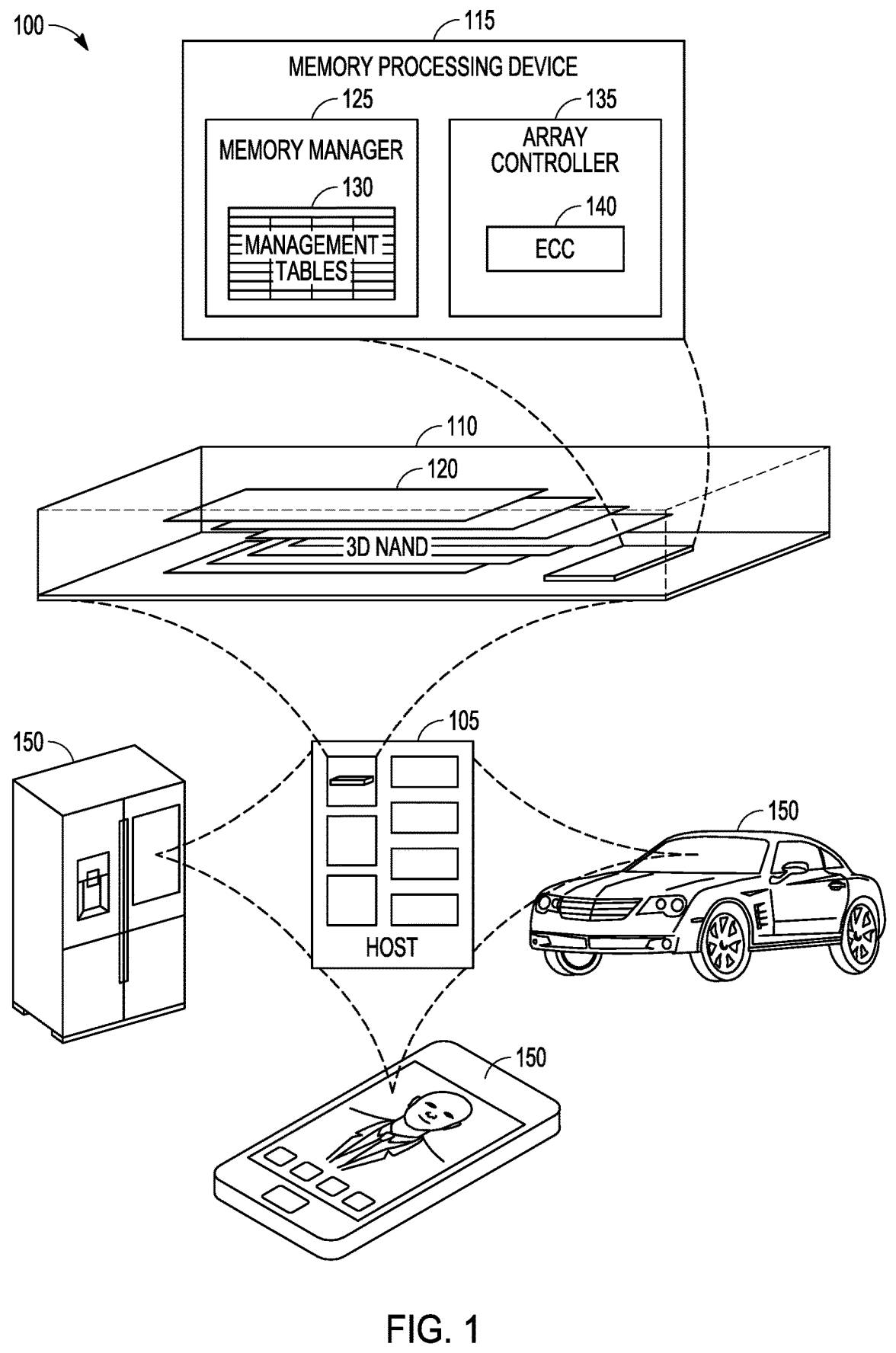

100

115

MEMORY PROCESSING DEVICE

125

MEMORY MANAGER

130

MANAGEMENT TABLES

135

ARRAY CONTROLLER

140

ECC

110

120

3D NAND

150

105

HOST

SYSTEMS HAVING A PHASE FREQUENCY DETECTOR

PRIORITY APPLICATION

This application is a U.S. National Stage Application under 35 U.S.C. 371 from International Application No. PCT/CN2021/091871, filed 6 May 2021, published as WO 2022/232982, which is incorporated herein by reference in its entirety.

FIELD OF THE DISCLOSURE

Embodiments of the disclosure relate generally to circuits in systems, and more specifically, to phase frequency detectors in systems.

BACKGROUND

Memory devices are typically provided as internal, semiconductor, integrated circuits in computers or other electronic devices. There are many different types of memory, including volatile and non-volatile memory. Volatile memory requires power to maintain its data and includes random-access memory (RAM), dynamic random-access memory (DRAM), or synchronous dynamic random-access memory (SDRAM), among others. Non-volatile memory can retain stored data when not powered, and includes flash memory, read-only memory (ROM), electrically erasable programmable ROM (EEPROM), erasable programmable ROM (EPROM), resistance variable memory, such as phase-change random-access memory (PCRAM), resistive random-access memory (RRAM), magnetoresistive random-access memory (MRAM), or three-dimensional (3D) XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

For a universal flash storage (UFS™) on a phone platform such as a phone printed circuit board (PCB), a reference clock can be affected by jitter, which is an unexpected sudden frequency or phase change, from other parts of the phone platform. For example, the UFS electrical interface at the UFS interconnect layer in a layered communications architecture can handle connection between a UFS host and a UFS device, according to a mobile industry processor interface (MIPI®)) M-PHY$^{SM}$ (MPHY) specification for a physical layer (PHY). MPHY is a high-speed data communications physical layer standard developed by the MIPI Alliance, which is a global, open membership organization that develops interface specifications for the mobile electronics environment. A UFS's MPHY provides for a sleep mode that can be entered and exited on the phone platform.

When the sleep mode is exited, other phone components can also experience a "power on" process. More unexpected jitter can be generated among other phone components, including a reference clock source, when power on the phone platform is consumed at the same time. Other storage systems can experience similar issues. Enhancements to a phase lock loop (PLL) circuit can be used to address the issue of unexpected jitter with respect to a reference clock.

BRIEF DESCRIPTION OF THE DRAWINGS

The drawings, which are not necessarily drawn to scale, illustrate generally, by way of example, but not by way of limitation, various embodiments discussed in the present document.

FIG. 1 illustrates an example of an environment including one or more memory devices, according to various embodiments.

DETAILED DESCRIPTION

Figure 2:
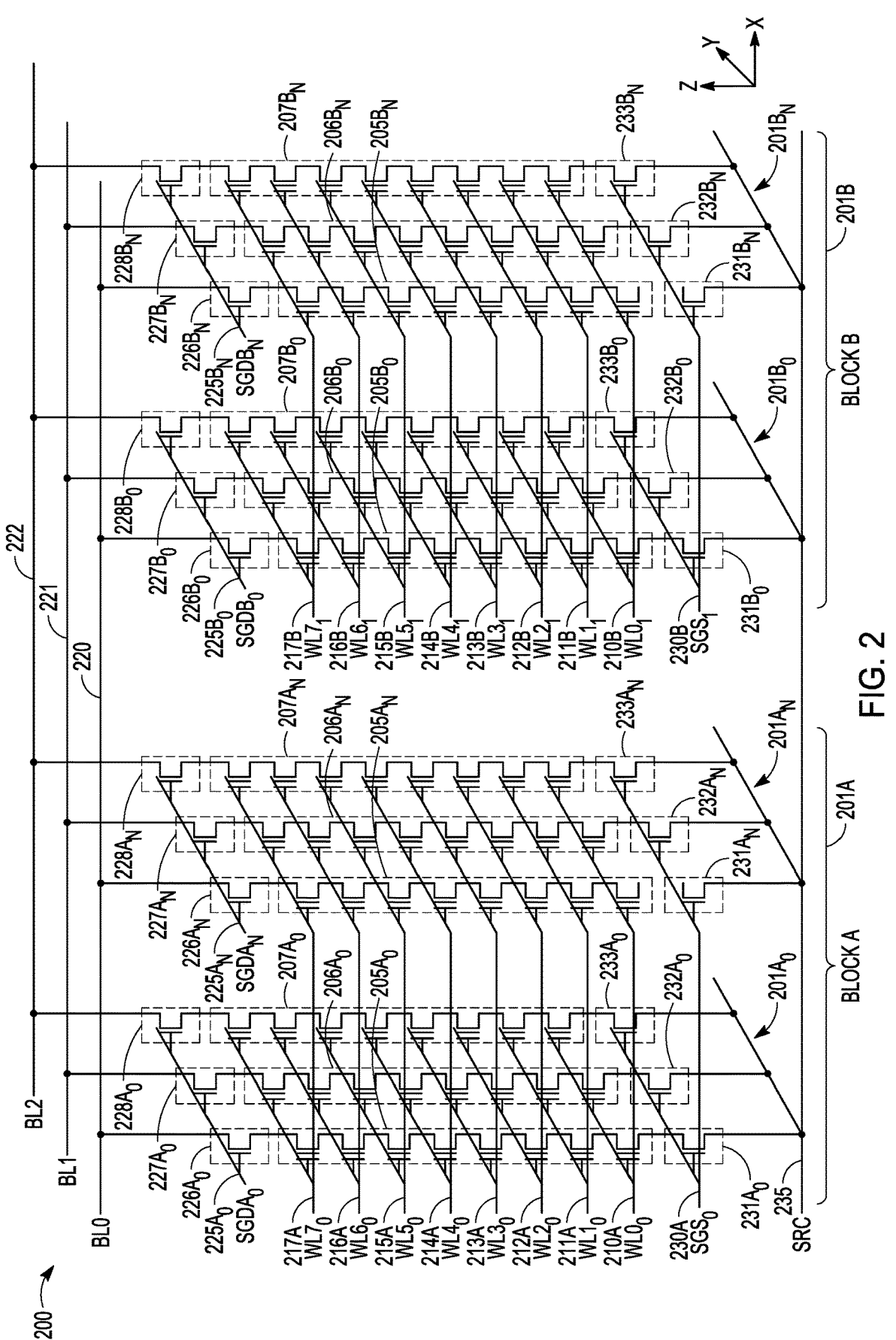
FIGS. 2 and 3 illustrate schematic diagrams of examples of a three-dimensional NAND architecture for a semiconductor memory array, according to various embodiments.

The following detailed description refers to the accompanying drawings that show, by way of illustration, various embodiments that can be implemented. These embodiments are described in sufficient detail to enable those of ordinary skill in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

To address jitter or similar variations to signals such as reference clocks, a PLL can be implemented to track and follow frequency change on such signals at a faster rate. It is desired that a PLL go to a stable status, which is a lock process, as fast as possible in systems such as on a cell phone's PCB. For a reference clock (RefCLK), traditional ways to increase PLL lock speed to return to a stable status can include increasing the frequency of a phase frequency detector (PFD) of the PLL, increasing bandwidth of a voltage-controlled oscillator (VCO) of the PLL, and using a higher RefCLK itself.

When a RefCLK is subjected to sudden jitter, a phase delta, which is a phase difference, between the RefCLK and a feedback of the PLL can be large, such as over 180 degrees. For this extreme condition, a classic PFD may not be fast enough to keep a PLL locking as desired. In addition, the abovementioned traditional ways to increase PLL lock speed may not improve on this condition. A limitation of classic PFDs is that a classic PFD in a PLL circuit only tracks the rising edges of the RefCLK and the PLL Feedback. For the condition that the phase delta between the RefCLK and the PLL Feedback is already over 180 degrees, due to unexpected jitter, the classic PFD only attempts to send an up signal to follow the phase delta. The up signal is a signal to push a tuning voltage of a VCO up to provide a catch-up condition to eventually lock, where outputs of the PFD are coupled to the inputs of the VCO. This catch-up approach, for a phase delta over 180 degrees, has as a large tracking-time cost with respect to operation.

In various embodiments, a phase frequency detector can be structured to track the falling edges of two input signals to detect a phase difference between the two signals and to generate one or more signals that can be used to adjust one of the signals with respect to the other when the phase difference is greater than 180 degrees. Embodiments can include a novel PFD design for a PLL circuit to provide fast tracking to regain lock, when a RefCLK is affected by sudden phase or frequency change. Such a PFD module can track the falling edge of the RefCLK and PLL Feedback in addition to tracking the rising edge of the RefCLK and the PLL Feedback. The falling edge of the RefCLK can be checked with a down signal to decide to reset a D-flip-flop to which the RefCLK is input. The falling edge of the PLL Feedback can be checked with an up signal to decide to reset a D-flip-flop to which the PLL Feedback is input. The design can include logic circuitry implemented to detect if a phase delta greater than 180 degrees (one signal's falling edge is before another's rising edge) has happened. In response to detecting this occurrence of the phase delta being greater than 180 degrees, the logical handling can reset the D-flip-flop to control the up signal or the down signal.

This novel PFD design does not affect the normal lock speed associated with a traditional PFD when phase jitter in a short period is small, that is, the phase delta between the RefCLK and the PLL Feedback is less than 180 degrees. This novel PFD design improves the lock speed when phase jitter in a short period is large, that is, the phase delta between the RefCLK and the PLL Feedback is greater than 180 degree. This PFD design can be implemented in a PLL in a memory system for a RefCLK received from a host platform. This PLL can be arranged in a processing device for a controller of the memory system. This PFD design can be implemented in a PLL in a number of different devices.

Memory devices of a memory system can include individual memory die, which may, for example, include a storage region comprising one or more memory arrays of memory cells, implementing one (or more) selected storage technologies. Such memory die will often include support circuitry for operating the memory array(s). Other examples, sometimes known generally as "managed memory devices,"

include assemblies of one or more memory die associated with controller functionality configured to control operation of the one or more memory die. Such controller functionality can simplify interoperability with an external device, such as a host. In such managed memory devices, the controller functionality may be implemented on one or more dies also incorporating a memory array or on a separate die. In other examples, one or more memory devices may be combined with controller functionality to form a solid-stage drive (SSD) storage volume.

Semiconductor memory arrays on both NOR and NAND flash architectures are accessed through decoders that activate specific memory cells by selecting the word line coupled to their gates. In a NOR architecture for a semiconductor memory array, once activated, the selected memory cells place their data values on bit lines, causing different currents to flow depending on the state at which a particular cell is programmed. In a NAND architecture for a semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. Flash memory cells can also represent more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC has been referred to as a memory cell that can store two bits of data per cell (e.g., one of four programmed states). MLC is used herein in its broader context, to refer to any memory cell(s) that can store more than one bit of data per cell (i.e., that can represent more than two programmed states). Herein, a memory cell that can store two bits of data per cell (e.g., one of four programmed states) can be referred to as a duo-level cell (DLC). A triple-level cell (TLC) can refer to a memory cell that can store three bits of data per cell (e.g., one of eight programmed states). A quad-level cell (QLC) can store four bits of data per cell, and a penta-level cell (PLC) can store five bits of data per cell.

Managed memory devices may be configured and operated in accordance with recognized industry standards. For example, managed NAND devices may be (as non-limiting examples) a UFS device, an embedded multi-media controller (eMMC™) device, etc. For example, in the case of the above examples, UFS devices may be configured in accordance with Joint Electron Device Engineering Council (JEDEC) standards (e.g., JEDEC standard JESD223D, entitled "JEDEC UFS Flash Storage 3.0," and/or updates or subsequent versions to such standard). Similarly, identified eMMC devices may be configured in accordance with JEDEC standard JESD84-A51, entitled "JEDEC eMMC standard 5.1," and/or updates or subsequent versions to such standard.

An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells, to obviate internal battery supply requirements, thus allowing the drive to be more versatile and compact. Managed NAND devices can be used as primary or ancillary memory in various forms of electronic devices and are commonly used in mobile devices.

Both SSDs and managed memory devices can include a number of memory devices, including a number of dies or logical units (e.g., logical unit numbers or LUNs), and can include one or more processors or other controllers performing logic functions used to operate the memory devices or interface with external systems. Such SSDs and managed memory devices can include one or more flash memory die, including a number of memory arrays and peripheral circuitry thereon. The flash memory arrays can include a number of blocks of memory cells organized into a number of physical pages. In some examples, the SSDs can also include DRAM or static random-access memory (SRAM) (or other forms of memory die or other memory structures). Similarly, managed NAND devices can include one or more arrays of volatile and/or nonvolatile memory separate from the NAND storage array and either within or separate from a controller. Both SSDs and managed NAND devices can receive commands from a host in association with memory operations, such as read or write operations, to transfer data (e.g., user data and associated integrity data, such as error data and address data, etc.) between the memory devices and the host, or erase operations to erase data from the memory devices. SSDs and managed memory devices can use a reference signal associated with a PLL circuit having a PFD as taught herein.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and Internet-connected appliances or devices (e.g., Internet-of-Things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor): memory (e.g., one or more volatile or non-volatile RAM memory device, such as DRAM, mobile or low-power double-data-rate synchronous DRAM (DDR SDRAM), etc.); and a storage device (e.g., non-volatile memory (NVM) device, such as flash memory, ROM, an SSD, an MMC, or other memory card structure or assembly, etc.). In certain examples, electronic devices can include a user interface (e.g., a display, touch-screen, keyboard, one or more buttons, etc.), a graphics processing unit (GPU), a power management circuit, a baseband processor, or one or more transceiver circuits, etc.

FIG. 1 illustrates an example of an environment 100 including a host device 105 and a memory system 110 configured to communicate over a communication interface. The host device 105 or the memory system 110 may be included in a variety of products 150, such as IoT devices (e.g., a refrigerator or other appliance, sensor, motor or actuator, mobile communication device, automobile, drone, etc.) to support processing, communications, or control of the product 150.

The memory system 110 includes a memory processing device 115 and a memory array 120 including, for example, a number of individual memory die (e.g., a stack of 3D NAND die). In 3D architecture semiconductor memory technology, vertical structures are stacked, increasing the number of tiers, physical pages, and accordingly, the density of a memory device (e.g., a storage device). In an example, the memory system 110 can be a discrete memory or storage device component of the host device 105. In other examples, the memory system 110 can be a portion of an integrated circuit (e.g., system on a chip (SoC), etc.), stacked or otherwise included with one or more other components of the host device 105.

One or more communication interfaces can be used to transfer data between the memory system 110 and one or more other components of the host device 105, such as a Serial Advanced Technology Attachment (SATA) interface, a Peripheral Component Interconnect Express (PCIe) interface, a Universal Serial Bus (USB) interface, a UFS interface, an eMMC™ interface, or one or more other connectors or interfaces. The host device 105 can include a host system, an electronic device, a processor, a memory card reader, or one or more other electronic devices external to the memory system 110. In some examples, the host device 105 may be a machine having some portion, or all, of the components discussed in reference to the machine 1100 of FIG. 11.

The memory processing device 115 can receive instructions from the host device 105, and can communicate with the memory array 120, such as to transfer data to (e.g., write or erase) or from (e.g., read) one or more of the memory cells, planes, sub-blocks, blocks, or pages of the memory array 120. The memory processing device 115 can include, among other things, circuitry or firmware, including one or more components or integrated circuits. For example, the memory processing device 115 can include one or more memory control units, circuits, or components configured to control access across the memory array 120 and to provide a translation layer between the host device 105 and the memory system 110. The memory processing device 115 can include one or more input/output (I/O) circuits, lines, or interfaces to transfer data to or from the memory array 120. The memory processing device 115 can include a memory manager 125, which can include a set of management tables 130, and an array controller 135.

The memory manager 125 can include, among other things, circuitry or firmware, such as a number of components or integrated circuits associated with various memory management functions. In some embodiments, the functions of the memory manager 125 are implemented by a controller (or processor) executing the instructions of firmware. For example, memory manager 125 can, in some examples, be implemented at least in part by one or more processors, which may execute instructions stored in memory. The management tables 130 can similarly be stored on the memory processing device 115, in either of such memory device locations. In other examples the instructions and/or management tables 130 may be stored in certain blocks of the NAND die stack and loaded into the working memory of memory processing device 115 during operation. Those skilled in the art will recognize that, in some examples, the components and functions of memory manager 125 and array controller 135 can be implemented by any combination of components (or subsets thereof) described herein and may include additional hardware components.

For purposes of the present description, example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory system 110.

The memory manager 125 can include the set of management tables 130 configured to maintain various information associated with one or more components of the memory system 110 (e.g., various information associated with a memory array or one or more memory cells coupled to the memory processing device 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory processing device 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory array 120 coupled to the memory processing device 115. The memory operations can be based on, for example, host commands received from the host device 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory array 120 coupled to the memory processing device 115. The memory processing device 115 can be configured to actively detect and recover from error occurrences (e.g., bit errors, operation errors, etc.) associated with various operations or storage of data, while maintaining integrity of the data transferred between the host device 105 and the memory system 110, or maintaining integrity of stored data (e.g., using Redundant Array of Independent Disks (RAID) storage, etc.), and can remove (e.g., retire) failing memory resources (e.g., memory cells, memory arrays, pages, blocks, etc.) to prevent future errors.

The memory array 120 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB DLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the write time and twice the program/erase (P/E) cycles as a corresponding TLC memory device. Other examples can include other numbers or arrangements. In some examples, a memory device, or a portion thereof, may be selectively operated in SLC mode or in a desired MLC mode (such as DLC, TLC, QLC, etc.).

In operation, data is typically written to or read from the NAND memory system 110 in pages and erased in blocks. However, one or more memory operations (e.g., read, write, erase, etc.) can be performed on larger or smaller groups of memory cells, as desired. The data transfer size of a NAND memory system 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes or may require different amounts of metadata associated therewith. For example, different memory device types may have different bit error rates, which can lead to different amounts of metadata to ensure integrity of the page of data (e.g., a memory device with a higher bit error rate may require more bytes of error correction code data than a memory device with a lower bit error rate). As an example, a MLC NAND flash device may have a higher bit error rate than a corresponding SLC NAND flash device. As such, the MLC device may require more metadata bytes for error data than the corresponding SLC device.

FIG. 2 illustrates an example schematic diagram of an embodiment of an example 3D NAND architecture for a semiconductor memory array 200 that can be implemented as memory array 120 of FIG. 1. The 3D NAND architecture semiconductor memory array 200 can include a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third B), memory strings $205B_n$-$207B_n$), etc.), organized in blocks (e.g., block A 201A, block B 201B, etc.) and sub-blocks (e.g., sub-block $A_0$ $201A_0$, sub-block $A_n$ $201A_n$, sub-block $B_0$ $201B_0$, sub-block $B_n$ $201B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS 231 $A_0$-$233A_0$, first-third $A_n$ SGS $231A_n$-$233A_n$, first-third $B_0$ SGS 231 $B_0$-$233B_0$, first-third $B_n$ SGS $231B_n$-$233B_n$, etc.) and a drain-side select gate (SGD) (e.g., first-third $A_0$ SGD $226A_0$-$228A_0$, first-third $A_n$ SGD $226A_n$-$228A_n$, first-third $B_0$ SGD $226B_0$-$228B_0$, first-third $B_n$ SGD $226B_n$-$228B_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, with each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array 200, and accordingly, specific memory cells in a string, can be accessed or controlled using respective access lines. Groups of select gates can be accessed using various select lines. For example, first-third $A_0$ SGD $226A_0$-$228A_0$ can be accessed using an $A_0$ SGD line $SGDA_0$ $225A_0$, first-third $A_n$ SGD $226A_n$-$228A_n$ can be accessed using an $A_n$ SGD line $SGDA_n$ $225A_n$, first-third $B_0$ SGD $226B_0$-$228B_0$ can be accessed using an $B_0$ SGD line $SGDB_0$ $225B_0$, and first-third $B_n$ SGD $226B_n$-$228B_n$ can be accessed using an $B_n$ SGD line $SGDB_n$ $225B_n$. First-third $A_0$ SGS $231A_0$-$233A_0$ and first-third $A_n$ SGS $231A_n$-$233A_n$ can be accessed using a gate select line $SGS_0$ 230A, and first-third $B_0$ SGS $231B_0$-$233B_0$ and first-third $B_n$ SGS $231B_n$-$233B_n$ can be accessed using a gate select line $SGS_1$ 230B.

In an example, the memory array 200 can include a number of levels of semiconductor material (e.g., polysilicon, etc.) configured to couple the CGs of each memory cell or select gate (or a portion of the CGs or select gates) of a respective tier of the array 200. Specific strings of memory cells in the array can be accessed, selected, or controlled using a combination of bit lines (BLs) and select gates, and specific memory cells at one or more tiers in the specific strings can be accessed, selected, or controlled using one or more access lines (e.g., word lines).

Figure 3:
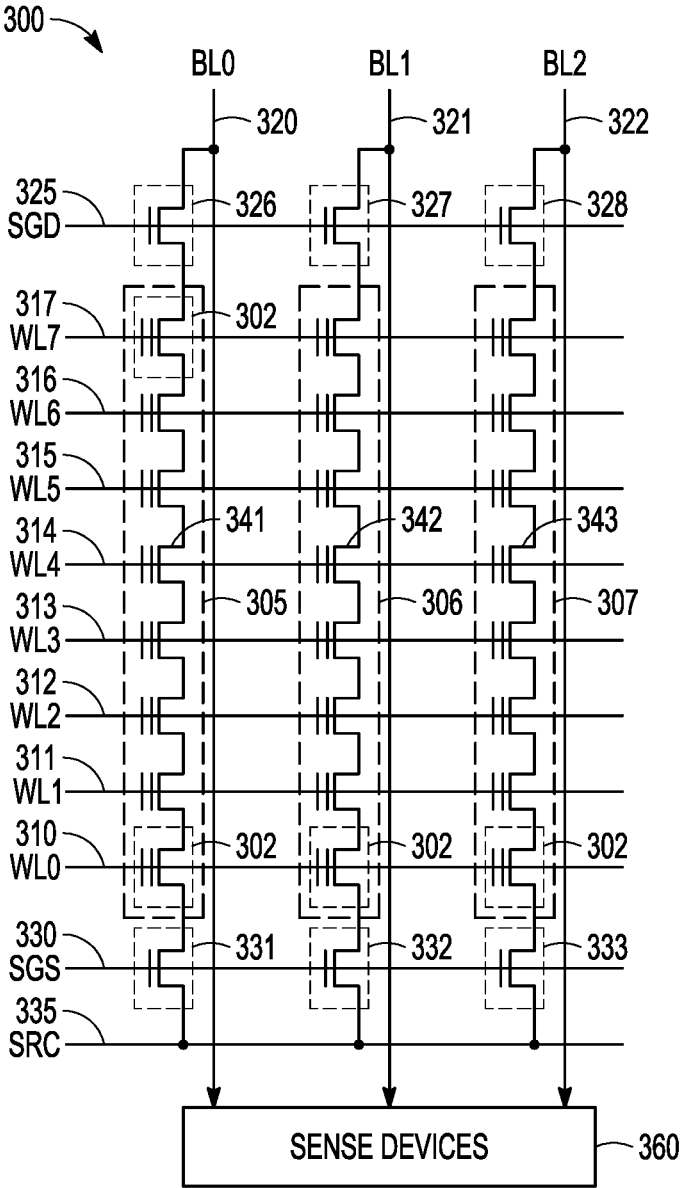

FIG. 3 illustrates an example schematic diagram of a portion of a semiconductor memory array 300 in a NAND architecture that can be implemented as memory array 120 of FIG. 1. The portion of the NAND architecture semiconductor memory array 300 can include a plurality of memory cells 302 arranged in a two-dimensional (2D) array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture for a semiconductor memory device, such as illustrated in FIG. 2.

Each string of memory cells is coupled to a source line (SRC) 335 using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third CGs 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or FN tunneling, etc.) from the channels to the floating gates or charge trap regions of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (e.g., Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells or to retain the values stored on such memory cells not targeted for programming. As the distance between an applied program voltage and the non-targeted memory cells increases, the pass voltage used to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages or number of word lines can be higher or lower, or more or less. The sense amplifiers 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or FN tunneling, etc.) from the floating gates of the targeted memory cells to the channels.

Figure 4:
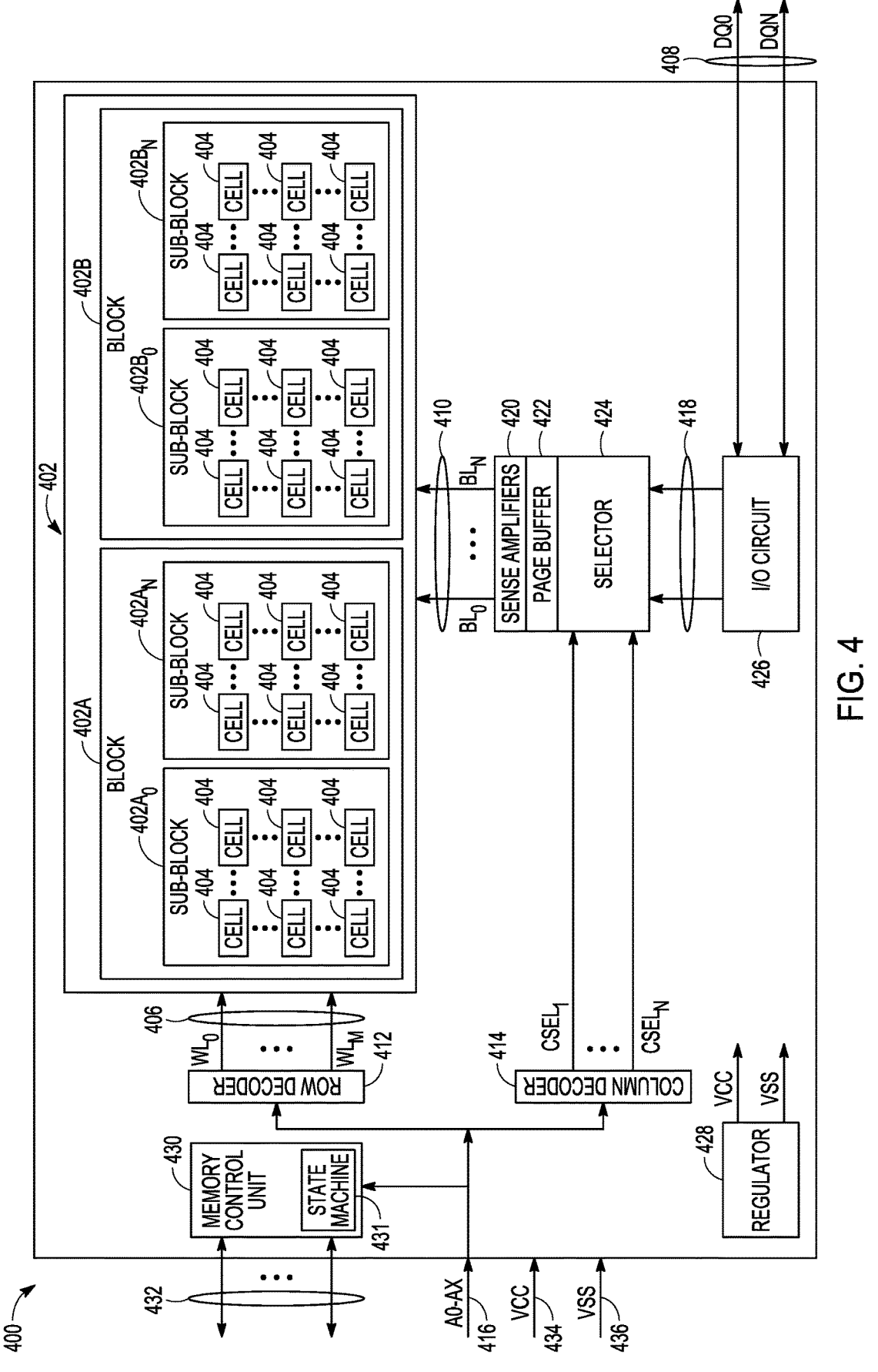
FIG. 4 illustrates an example block diagram of a memory module, according to various embodiments.

FIG. 4 illustrates an example block diagram of a memory device 400, which can be implemented in memory system 110 of FIG. 1, including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an I/O circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A$_0$, 402A$_n$, and the second block 402B can include first and second sub-blocks 402B$_0$, 402B$_n$. Each sub-block can include a number of physical pages, with each page including a number of memory cells 404. Although illustrated herein as having two blocks, with each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432 or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The memory control unit 430 can include a state machine 431 coupled to the row decoder 412, the column decoder 414, and the I/O circuit 426. The state machine 413 can also output status data of the flash memory such as READY/BUSY or PASS/FAIL. In some designs, the state machine 413 can be configured to manage the programming process. The row decoder 412 and the column decoder 414 can receive and decode the address signals (A0-AX) from the address line 416, determine which of the memory cells 404 are to be accessed, and provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using I/O lines (DQ0-DQN) 408, address lines 416 (A0-AX), or control lines 432. The I/O circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

A row decoder of a memory device, such as the row decoder 412 of FIG. 4, can include high voltage (HV) switches configured to translate supply voltage of specific magnitudes to access lines (e.g., a global word line (GWL)) of memory cells. A HV switch, which is also referred to as a high voltage level shifter, is used in many memory devices to shift a voltage to one or more memory cells in a memory device to a higher level for one or more operations such as program and erase operations. HV is defined by the application of the HV switch. With the HV switch implemented with a memory device, HV is defined by one or more operations of the memory device. For a NAND memory device, these HVs are voltages used for the NAND memory cell program and erase operations. These HVs are typically generated by onboard charge pumps. HV can range from about 20 V to about 32 V. The low voltages of the NAND memory device are logic voltages, which can be less than or equal to about 3.3 V. The low voltages can typically be provided by external power sources of less than or equal to 3.3V. Output voltages from the HV switches can be provided to the access lines to memory cells 404.

Figure 5:
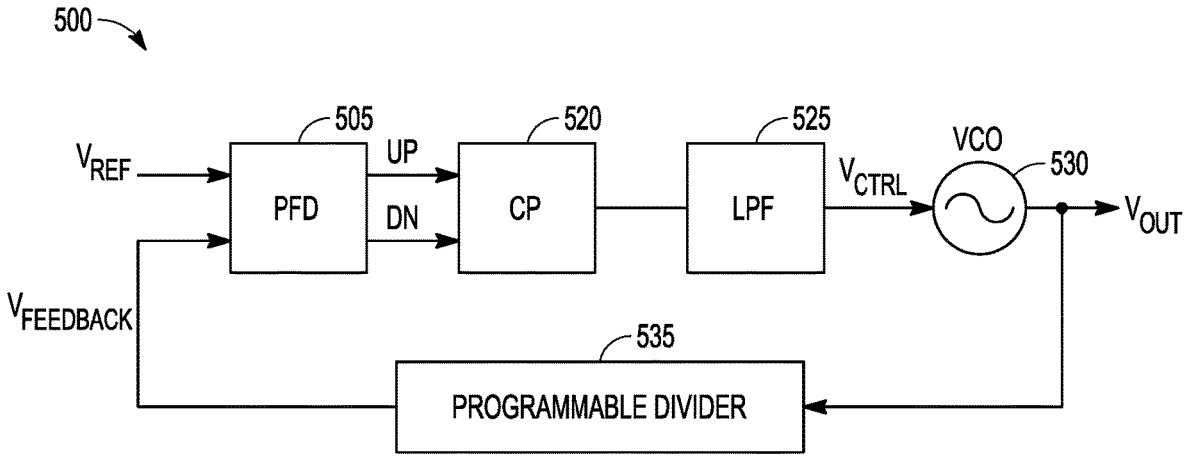
FIG. 5 is a block diagram of an example phase lock loop circuit for phase locking of an input reference signal, according to various embodiments.

FIG. 5 is a block diagram of an embodiment of an example PLL circuit 500 for phase locking of an input reference signal. The PLL circuit 500 can be implemented in the memory system 110 of FIG. 1. The PLL circuit 500 includes a PFD 505, a charge pump (CP) 520, and a VCO 530. A reference voltage ($V_{REF}$) signal is provided as an input to the PFD 505 for comparison with a feedback voltage (V Feedback) signal of the output voltage ($V_{OUT}$) signal provided as another input to the PFD 505. The $V_{Feedback}$ signal can be provided to the input of the PFD 505 from a programmable divider 535 coupled to receive the $V_{OUT}$ signal. The programmable divider 535 provides a feedback divider that can be used to divide the VCO frequency to the PFD frequency, which allows the PLL circuit 500 to generate output frequencies that are multiples of the PFD frequency. A divider may also be used in the reference path, which permits higher frequency references to be used than the PFD frequency. The programmable divider 535 can be implemented as a N counter such as, but not limited to, N=384 for example.

The PFD 505 outputs an up signal and a down signal as input to the CP 520, which provides control to the CP 520 to control adjustments to establish phase lock. A low-pass filter (LPF) 525 can be coupled between the CP 520 and the VCO 530 to filter the output of the CP 520 to provide a control voltage ($V_{CTRL}$) signal to the VCO 530 that provides the $V_{OUT}$ signal. The up signal and the down signal can be provided by the PFD 505 in response to the PFD 505 detecting a phase delta between the $V_{REF}$ signal and the $V_{Feedback}$ signal. With the phase delta below 180 degrees, the PFD 505 can provide the up signal and the down signal in substantially the same manner as traditional PFDs. With the phase delta above 180 degrees, the PFD 505 can provide the up signal and the down signal in a different manner than traditional PFDs. The detection and generation of the up and down signals, when the phase delta is greater than 180 degrees, is provided by the PFD 505 from tracking the falling edges of the reference signal and the feedback signal.

Figure 6:
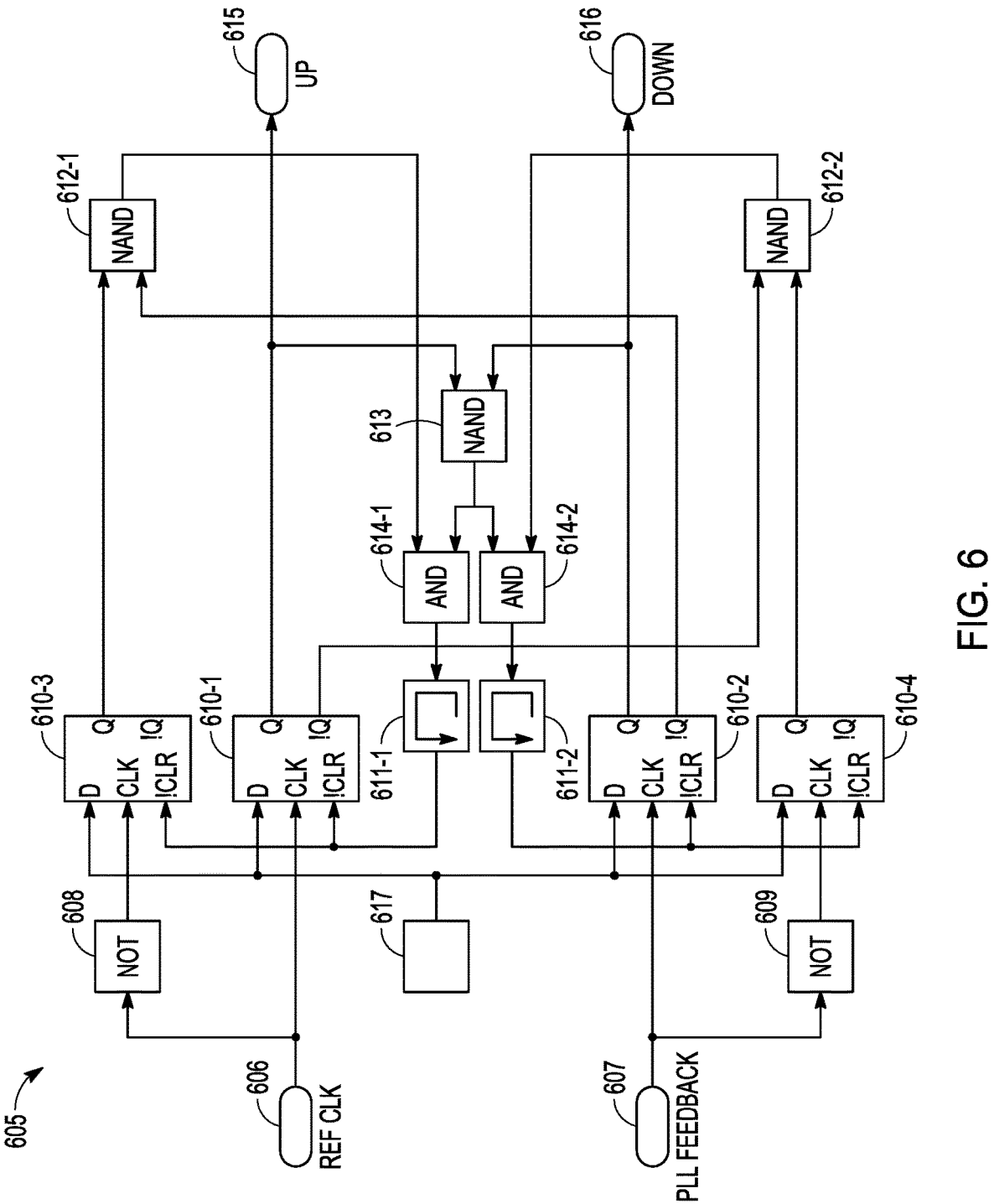
FIG. 6 is a schematic of an example phase frequency detector structured to track the falling edges of a reference signal and a feedback signal, according to various embodiments.

FIG. 6 is a schematic of an embodiment of an example PFD 605 structured to track the falling edges of a reference signal and a feedback signal. The PFD 605 can be implemented as the PFD 505 of FIG. 5. The PFD 605 includes an input node 606 to receive a reference signal, RefCLK, and an input 607 to receive a feedback signal, PLL Feedback, from the output of a PLL in which the PFD 605 is implemented. The RefCLK, in this example, is provided to a clock (clk) input of a D flip-flop 610-1 and the PLL Feedback, in this example, is provided to a clk input of a D flip-flop 610-2. The complement of the RefCLK is provided to a clk input of a D flip-flop 610-3 via a NOT gate 608 and the complement of the PLL Feedback is provided to a clk input of a D flip-flop 610-4 via a NOT gate 609. A data node, D, of each of the D flip-flops 610-1, 610-2, 610-3, and 610-4 is coupled to a source node 617, which can be a supply voltage such as $V_{CC}$.

The main output, Q, of the D flip-flop 610-1 is coupled to an up-output node 615 of the PFD 605 and to a first input of a NAND gate 613. The complement output, !Q, of the D flip-flop 610-1 is coupled to a first input of a NAND gate 612-2. The main output, Q, of the D flip-flop 610-2 is coupled to a down-output node 616 of the PFD 605 and to a second input of the NAND gate 613. The complement output, !Q, of the D flip-flop 610-2 is coupled to a first input node of a NAND gate 612-1. The main output, Q, of the D flip-flop 610-3 is coupled to a second input of the NAND gate 612-1. The complement output, !Q, of the D flip-flop 610-3 can be left un-connected. The main output, Q, of the D flip-flop 610-4 is coupled to a second input of the NAND gate 612-2. The complement output, !Q, of the D flip-flop 610-4 can be left un-connected.

The output of the NAND gate 613, which has inputs coupled to both the D flip-flops 610-1 and 610-2, is coupled to a first input of an AND gate 614-1 and to a first input of an AND gate 614-2. The output of the NAND gate 612-1 is coupled to a second input of the AND gate 614-1 and the output of the NAND gate 612-2 is coupled to a second input of the AND gate 614-2. The output of the AND gate 614-1 is coupled to an input of a buffer 611-1, whose output is coupled to the resets, !CLR, of the D flip-flops 610-1 and 610-3. The output of the AND gate 614-2 is coupled to an input of a buffer 611-2, whose output is coupled to the resets, !CLR, of the D flip-flops 610-2 and 610-4.

The D flip-flops 610-1 and 610-2 provide operation to provide the up signal and the down signal for a phase delta less than 180 degrees. The logic circuitry of the PFD 605 includes a set of logic gates coupled to outputs and inputs of the four D flip-flops to feed back signals to the four D flip-flops to detect a phase delta being larger than 180 degrees and to control the up signal and the down signal for this large phase delta. The falling edge of the RefCLK can be checked with a down signal to decide a reset of the D-flip-flop 610-1 to which the RefCLK is input. The falling edge of the PLL Feedback can be checked with an up signal to decide a rest of the D-flip-flop 610-2 to which the PLL Feedback is input.

A traditional PFD in a PLL circuit tracks the phase delta between the RefCLK and the PLL Feedback of the traditional PLL circuit by tracking rising edges of these signals. In the traditional PFD, if the phase delta is a large jitter that is over 180 degrees ($\pi$), the charge pump in its PLL circuit works at full duty cycle to catch up to establish a lock condition. If the large jitter occurs for a short period, and the RefCLK becomes normal, the traditional PFD has already overshot the lock condition and uses more time to slow down to compensate for the overshoot. If the short jitter period causes the phase delta to be below a negative 180 degrees ($-\pi$), the resultant operation of the traditional PFD is essentially the same, and the traditional PFD uses more time to overcome an undershoot. In contrast, embodiments of a PFD, as taught herein such as PFDs 505 and 605, can track the phase delta both by rising edge and falling edge of the RefCLK and the PLL Feedback, which allows a PLL circuit containing the enhanced PFD to recover faster from the large jitter on the RefCLK.

The PFD 605 of FIG. 6, compared to a traditional PFD, has additional D flip-flops and logic circuitry to support the additional D flip-flops. The PFD 605, in this embodiment, uses a total of four D flip-flops with two D flip-flops added to store the falling edge of the RefCLK and the PLL Feedback. The four D flip-flops with logic gates providing inputs to the reset inputs of the four D flip-flops can provide a structure that realizes a state machine in which a falling edge of the RefCLK and the PLL Feedback can reset the PFD 605 to status "0" that is a "no action" status. The PFD 605 can transition to either "−1" (slow down state) or "1" (speed up state) by a later rising edge. The arrangement of these four D flip-flops provides a relatively fast transition to reset the PFD 605 to state "0" when the phase delta is over π, which, for example, is the condition the RefCLK's falling edge being ahead of the PLL Feedback, which means there is a large jitter on the RefCLK. The falling edge reset of the structure of the PFD 605 provides a fast path for phase locking.

Figures 7A, 7B:
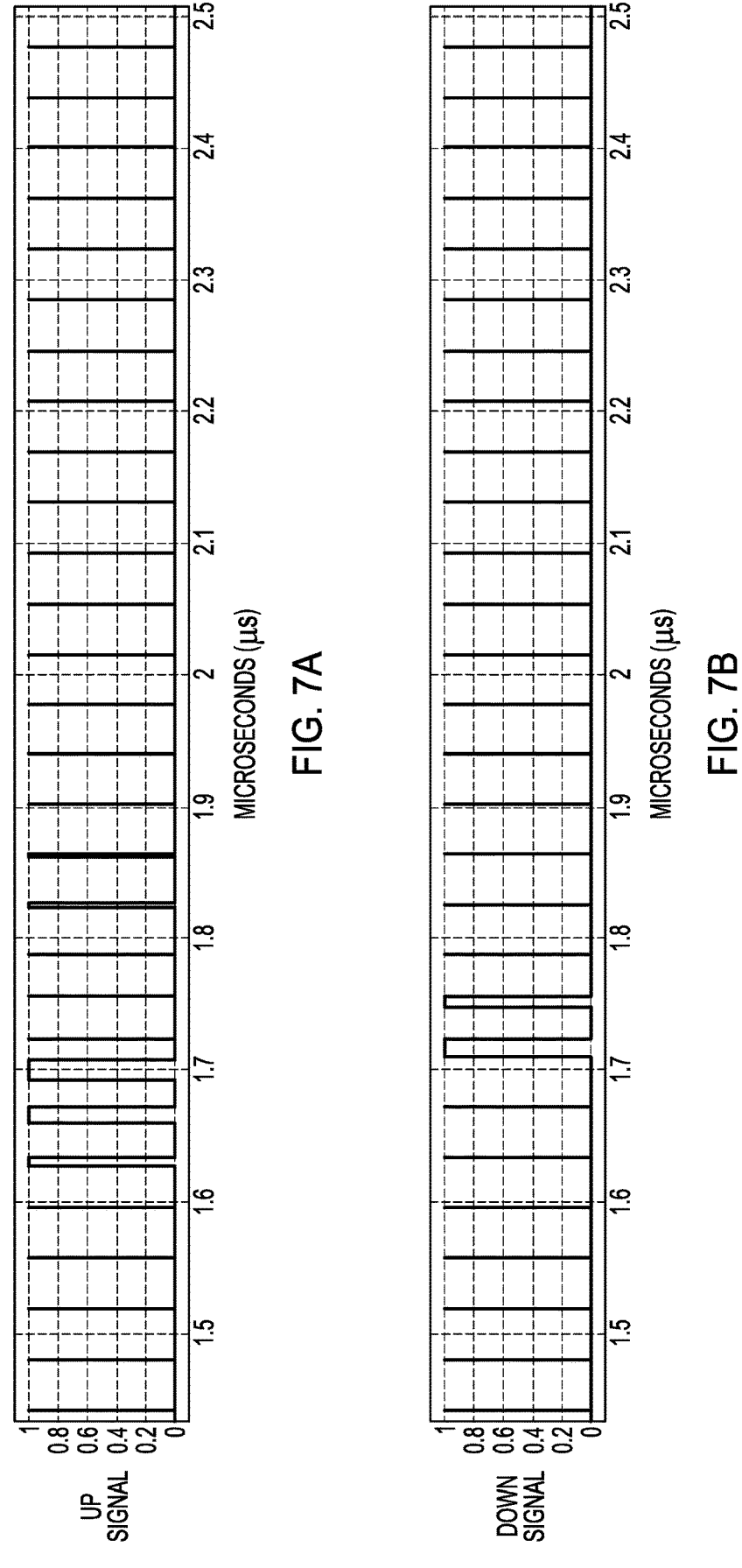
FIGS. 7A-7D illustrate a simulation of operation of the phase frequency detector of FIG. 6, according to various embodiments.
Figures 7C, 7D:
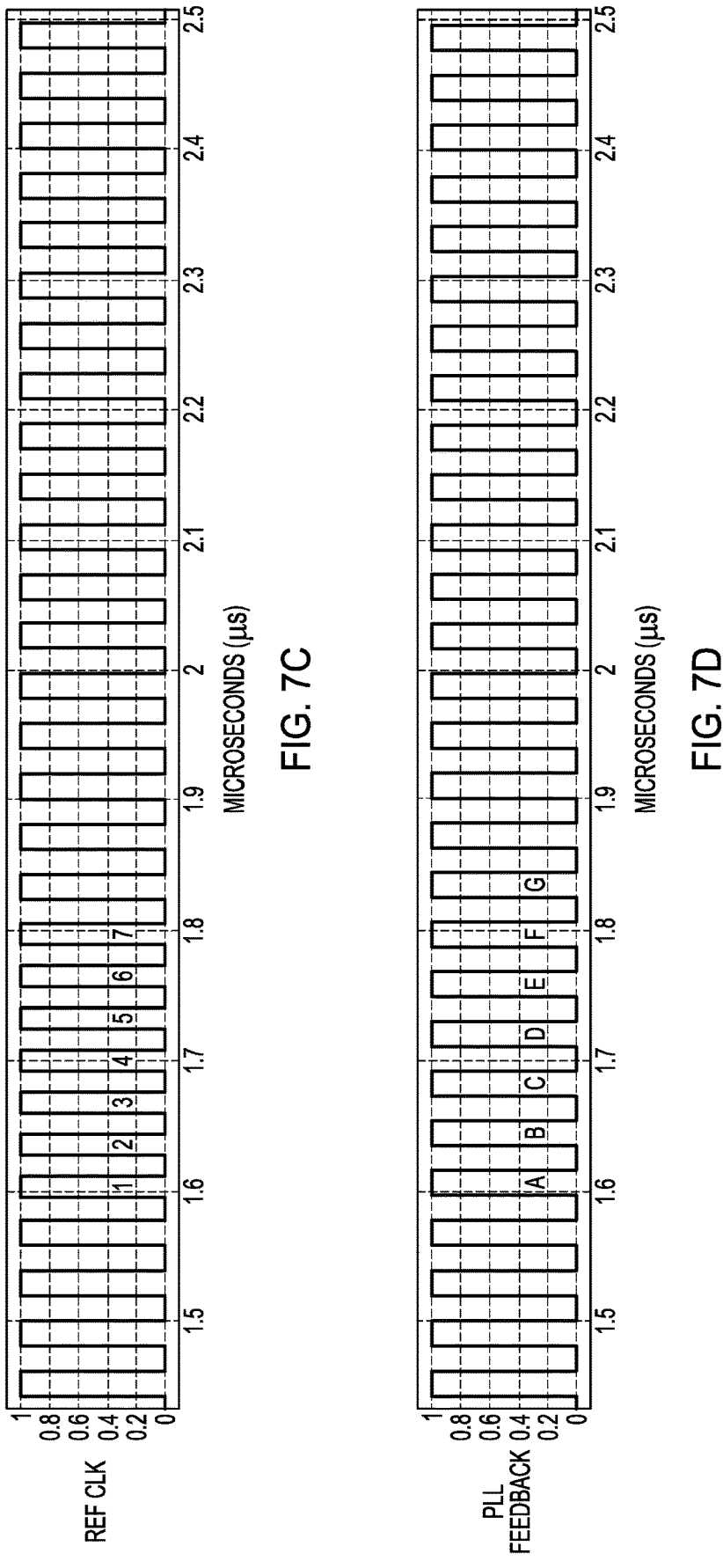

FIGS. 7A-7D illustrate a simulation of operation of the PFD 605 of FIG. 6. The conditions of the simulation include insertion of seven periods of jitter from 20 MHz to 31 MHz in a 26 MHz RefCLK. FIG. 7A shows an up signal generated by the PFD 605 under the simulated conditions, while FIG. 7B shows a down signal generated by the PFD 605 under the simulated conditions. FIG. 7C shows the seven inserted periods in the RefCLK as 1, 2, 3, 4, 5, 6, and 7, while FIG. 7D shows seven related periods in the PLL Feedback as a, b, c, d, e, f, and g. As shown in FIG. 7B relative to FIG. 7C, the down signal is generated after the 4 cycle in the RefCLK, and the up signal generated is reduced, as shown in FIG. 7A. The RefCLK's 4 cycle corresponds to the PLL Feedback's d cycle. With the phase delta between the RefCLK and the PLL Feedback being over π, the reset associated with the falling edge took effect. As a result, the 5 cycle did not continue to track the e cycle to which it was associated, but the 5 cycle of the RefCLK tracks the former d cycle of the PLL Feedback, because the phase delta between the 5 cycle and the d cycle was smaller. Before the 4 cycle of the RefCLK, the PFD 605 still outputs 'UP', which means that the RefCLK was faster. After the 4 cycle of the RefCLK, the PFD 605 outputs a longer down signal pulse, which means the RefCLK was slower, as the 5 cycle was slower than the d cycle. The mechanism provided by the new design of the PFD 605 causes fast tracking under the large phase delta condition of greater than 180 degrees.

Figures 8A, 8B:
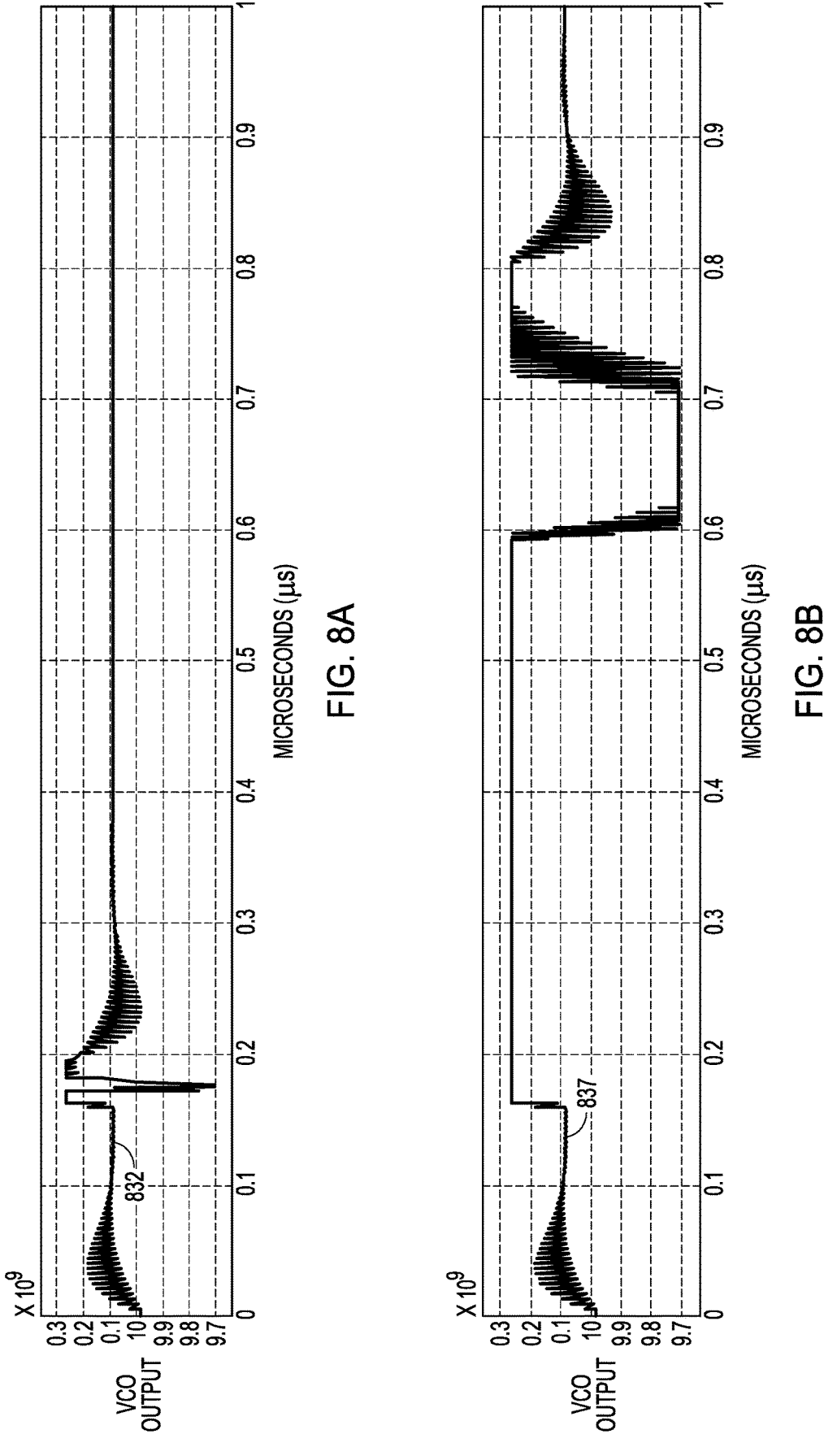
FIGS. 8A-8B illustrate a comparison of a voltage-controlled oscillator output for a phase lock loop circuit having the phase frequency detector of FIG. 6 and a voltage-controlled oscillator output for the phase lock loop circuit having a traditional phase frequency detector, according to various embodiments.

FIGS. 8A-8B illustrate a comparison of a VCO output for the PLL circuit having the PFD 605 of FIG. 6 and a VCO output for the PLL circuit having a traditional PFD. Curve 832 of FIG. 8A shows the output of the VCO used with the PFD 605 of FIG. 6 under the simulation conditions of FIGS. 7A-7D. Curve 837 of FIG. 8B shows the output of a VCO used with a traditional PFD in the PLL circuit under the simulation conditions of FIGS. 7A-7D. A traditional PFD of a PLL circuit does not adjust the down signal pulse to a longer interval of providing a non-baseline voltage. Limiting the adjustment of the up signal and the down signal to only adjusting the up signal slows the lock process in the traditional PLL circuit. Comparing the curve 832 and the curve 837 with the jitter added at 1.6 μs, use of the PLL circuit with the traditional PFD results in a 7.6 μs lock time, while use of the PLL circuit with the design of PFD 605 results in a 1.5 ρs lock time.

Figure 9:
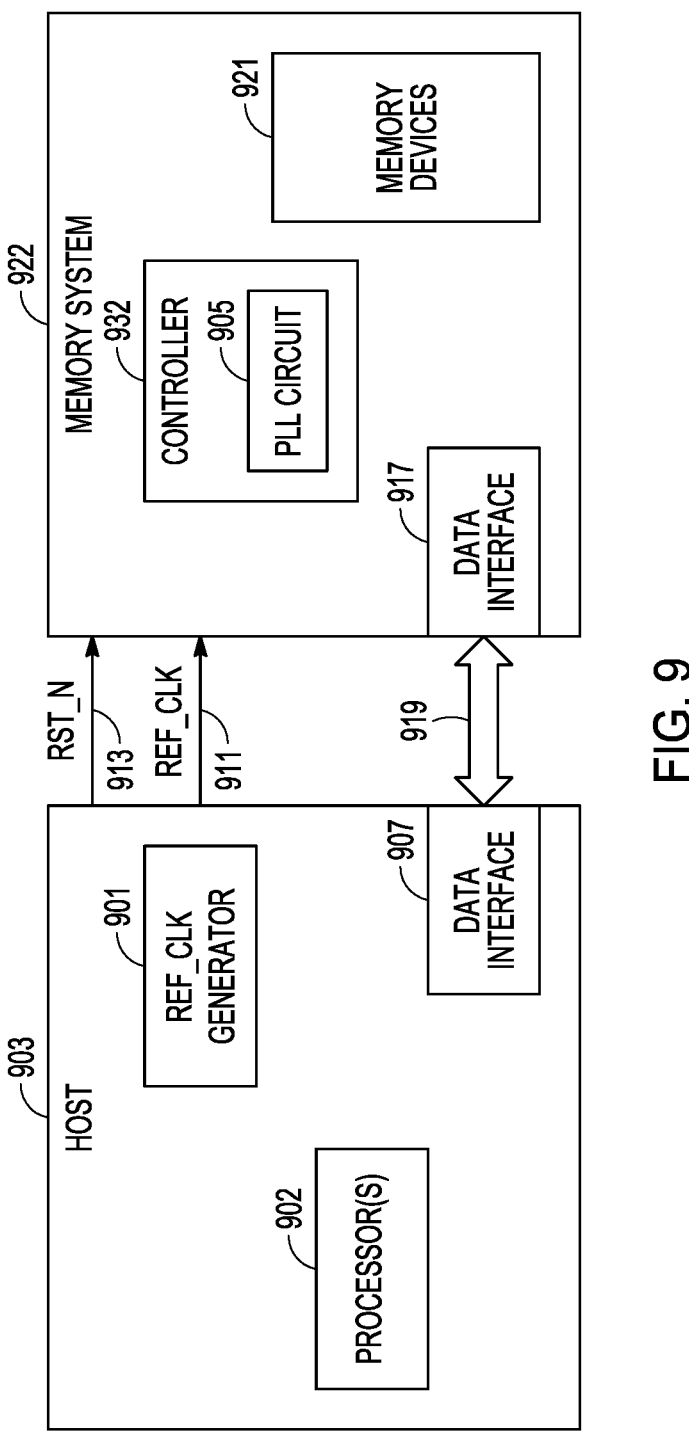
FIG. 9 is a block diagram of an example system having features to address fast recover from jitter in a reference clock signal used in the system, according to various embodiments.

FIG. 9 is a block diagram of an embodiment of an example system 900 having features to address fast recover from jitter in a reference clock signal used in the system 900. The system 900 includes a host 903 in operation with a memory system 922. The host 903 can include, among other instrumentalities, one or more processors 902 to execute operations to perform applications assigned to the host 903, and a data interface 907 to provide and receive data from the memory system 922. Data can be transferred between the host 903 and the memory system 922 using an interface 919. The one or more processors 902 can include or have access to stored instructions of the host 903 to control functions of the host 903. The host 903 can include a REF_CLK generator 901 to provide a REF_CLK signal 911 to the memory system 922. Other signals generated from the host 903 can include a RST_n signal 913, which is a hardware reset signal.

The memory system can include, among other instrumentalities, one or more memory devices 921 to store data received from the interface 919 via a data interface 917 in the memory system 922 and return the data, via the data interface 917, using the interface 919. The controller 932 can manage operations of components of the memory system 922 using instructions stored within the memory system 922. The controller 932 can include a PLL circuit 905 to address fast recover from jitter in the REF_CLK 911 received from the host 903. The PLL circuit 905 can provide a reference signal from the received REF_CLK 911 to various components of the memory system. The REF_CLK 911 generated from the host 903 can be a relatively low speed clock as a reference for the PLL circuit 905. Alternatively, or in conjunction with the controller 932, other components, such as but not limited to one or more of the memory devices 921, can include a PLL circuit such as PLL circuit 905. For example, the PLL circuit 905 can be structured in the memory control unit 430 of FIG. 4 with the REF_CLK 911 provided in the control lines 432. With one or more of the memory devices 921 or other components including a PLL circuit, the received REF_CLK 911 can be a relatively low speed clock common to all devices of the memory system 922 that have a PLL circuit, where the received REF_CLK 911 is used as a reference for the PLL circuit in each device. The individual PLL circuits can be used to provide an operational reference signal for the device in which it is located, where the operational reference signal can be higher than the received REF_CLK 911.

The PLL circuit 905 can be structured similar or identical to the PLL circuit 500 of FIG. 5. The PLL circuit 905 can include a PFD similar or identical to the PFD 605 of FIG. 6 arranged to track both the rising edges and the falling edges of a reference clock signal and a feedback signal of the PLL circuit 905 to provide adjustments to return to a lock condition when the reference clock signal is subjected to variations such as jitter. With such structure, the PLL circuit 905 can provide fast response to recover from a jitter condition in which the phase delta between the reference signal and the feedback sign of the PLL circuit 905 is greater than 180 degrees. Other embodiments of PFDs can be used that track the falling edges of a reference clock signal and a feedback signal to provide adjustments when the phase delta is greater than 180 degrees.

The system 900 can be structured in a number of formats. For example, the system 900 can be a UFS system with the host 903 being a UFS host and with the memory system 922 being a UFS device. Such a UFS system can be implemented on a cell phone platform. The system can be implemented other formats.

Figure 10:
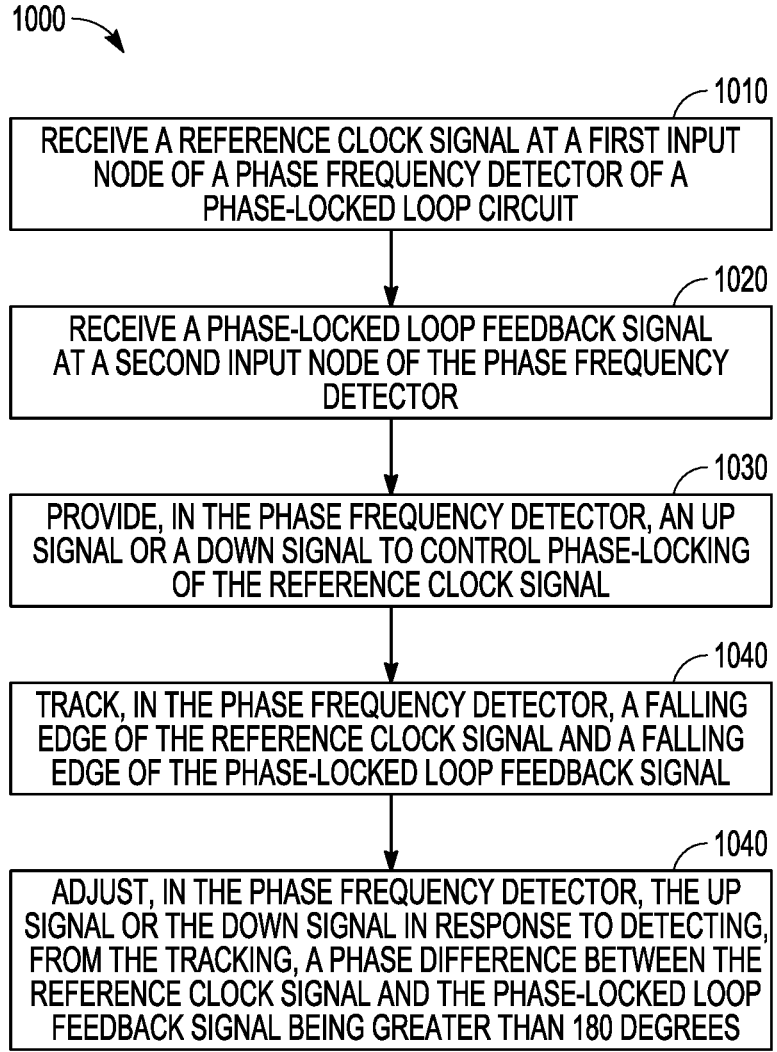
FIG. 10 is a flow diagram of features of an example method of controlling a reference clock signal, according to various embodiments.

FIG. 10 is a flow diagram of features of an embodiment of an example method 1000 of controlling a reference clock signal. At 1010, a reference clock signal is received at a first input node of a phase frequency detector of a phase-locked loop circuit. At 1020, a phase-locked loop feedback signal is received at a second input node of the phase frequency detector. At 1030, an up signal or a down signal is provided in the phase frequency detector to control phase-locking of the reference clock signal. At 1040, a falling edge of the reference clock signal and a falling edge of the phase-locked loop feedback signal in the phase frequency detector is tracked. At 1050, in response to detecting, from the tracking, a phase difference between the reference clock signal and the phase-locked loop feedback signal being greater than 180 degrees, the up signal or the down signal is adjusted in the phase frequency detector.

Variations of the method 1000 or methods similar to the method 1000 can include a number of different embodiments that may be combined depending on the application of such methods and/or the architecture of devices or systems in which such methods are implemented. Such variations can include performing the tracking by checking the falling edge of the reference clock signal with the down signal to decide, using a first set of logic gates, to reset a D-flip-flop receiving the reference clock signal, and checking the falling edge of the phase-locked loop feedback signal with the up signal to decide, using a second set of logic gates, to reset a D-flip-flop receiving the phase-locked loop feedback signal.

Variations of the method 1000 or methods similar to the method 1000 can include using the up signal to control the phase-locking for the phase difference being less than 180 degrees and using the down signal to control the phase-locking for the phase difference being greater than 180 degrees. Variations can include supporting the reference clock signal matching a higher system clock using a programmable frequency divider coupled between an output of the phase-locked loop circuit and the second input node of the phase frequency detector.

The method 1000 or methods similar to the method 1000 can be implemented in a number of different devices. Such methods can be implemented with the phase-locked loop circuit disposed in a controller of a memory system or other components of the memory system.

In a various embodiments, a phase frequency detector can be implemented to track a falling edge of a first signal and a falling edge of a second signal to facilitate re-capturing of a phase locking of the first signal and the second signal, in response to a sudden unexpected variation of one of the two signals. A phase frequency detector can include a first input node to receive a reference clock signal, a second input node to receive an input signal, and logic circuitry arranged to track a falling edge of the reference clock signal and a falling edge of the input signal. The phase frequency detector can also include an up-output node and a down-output node. The up-output node can be arranged to provide an up signal from the phase frequency detector and the down-output node can be arranged to provide a down signal from the phase frequency detector. The up signal or the down signal can be adjusted by the logic circuitry in response to a phase difference between the reference clock signal and the input signal being greater than 180 degrees when detected from tracking the falling edge of the reference clock signal and the falling edge of the input signal.

Variations of such a phase frequency detector or similar phase frequency detectors can include a number of different embodiments that may be combined depending on the application of such phase frequency detectors or the architecture of devices or systems in which such phase frequency detectors are implemented. Such variations can include the logic circuitry having a first D flip-flop to receive the reference clock signal, where the first D flip-flop has a reset input responsive to the down signal, and a second D flip-flop to receive the input signal, where the second D flip-flop has a reset input responsive to the up signal. The logic circuitry can include a third D flip-flop to receive a complement of the reference clock signal, where the third D flip-flop has a reset input responsive to the down signal, and a fourth D flip-flop to receive a complement of the input signal, where the fourth D flip-flop has a reset input responsive to the up signal.

In such an arrangement, the logic circuitry can include a number of NAND gates and gates arranged with the four D flip-flops. A first NAND gate can be implemented having an input coupled to a main output of the third D flip-flop and another input coupled to a complementary output of the second D flip-flop. A second NAND gate can be implemented having an input coupled to a main output of the fourth D flip-flop and another input coupled to a complementary output of the first D flip-flop. A third NAND gate can be implemented having an input coupled to the up-output node and another input coupled to the down-output node. A first AND gate can be implemented having an input coupled to an output of the first NAND gate and another input coupled to an output of the third NAND gate, with an output of the first AND gate arranged to provide a first signal to the first reset input. A second AND gate can be implemented having an input coupled to an output of the second NAND gate and another input coupled to the output of the third NAND gate, with an output of the second AND gate arranged to provide a second signal to the reset input of the second D flip-flop.

The logic circuitry phase of such a frequency detector can include a first delay device having an input coupled to an output of the first AND gate and having an output coupled to the reset input of the first D flip-flop and to the reset input of the third D flip-flop. The logic circuitry phase can include a second delay device having an input coupled to an output of the second AND gate and having an output coupled to the reset input of the second D flip-flop and the reset input of the fourth D flip-flop. The logic circuitry can include a data node coupled to a data input of the first D flip-flop, a data input of the second D flip-flop, a data input of the third D flip-flop, and a data input of the fourth D flip-flop.

In various embodiments, a phase-locked loop circuit comprises a voltage-controlled oscillator, a charge pump, and a phase frequency detector. The charge pump has an up-signal input, a down-signal input, and an output coupled to an input of the voltage-controlled oscillator. The phase frequency detector includes a first input node to receive a reference clock signal and a second input node coupled to an output of the voltage-controlled oscillator to receive a phase-locked loop feedback signal. The phase frequency detector can include logic circuitry arranged to track a falling edge of the reference clock signal and a falling edge of the received phase-locked loop feedback signal. The phase frequency detector can include an up-output node to provide an up signal to the up signal input of the charge pump and a down-output node to provide a down signal to the down-signal input of the charge pump. The logic circuitry adjusts the down signal in response to a phase difference between the reference clock signal and the received phase-locked loop feedback signal being greater than 180 degrees, determined from tracking the falling edge of the reference clock signal and the falling edge of the received phase-locked loop feedback signal.

Variations of such a phase-locked loop circuit or similar phase-locked loop circuits can include a number of different embodiments that may be combined depending on the application of such phase-locked loop circuits or the architecture of devices or systems in which such phase-locked loop circuits are implemented. Such variations can include the logic circuitry having a first D flip-flop to receive the reference clock signal, where the first D flip-flop has a reset input responsive to the down signal and having a second D flip-flop to receive the received phase-locked loop feedback signal, where the second D flip-flop has a reset input responsive to the up signal. Such variations can include the phase-locked loop circuit having a programmable divider coupled to the output of the voltage of the voltage-controlled oscillator and to the second input node of the phase frequency detector.

Variations of such a phase-locked loop circuit or similar phase-locked loop circuits can include the logic circuitry having at least four D flip-flops. A first one of the four D flip-flops can have an input to receive the reference clock signal. The second one of the four D flip-flops can have an input to receive an inverse of the reference clock signal. The third one of the four D flip-flops can have an input to receive the received phase-locked loop feedback signal. The fourth one of the four D flip-flops can have an input to receive an inverse of the received phase-locked loop feedback signal. The logic circuitry can include a set of logic gates coupled to outputs of the four D flip-flops to feed back signals to the four D flip-flops to control the up signal and the down signal.

In various embodiments, a system comprises a source node to provide a reference clock signal and a phase-locked loop circuit coupled to receive the reference clock signal. The phase-locked loop circuit can have a phase frequency detector and an output node to provide a phase-locked version of the received reference clock signal. The phase frequency detector can include a first input node to receive the reference clock signal, a second input node coupled to receive a phase-locked loop feedback signal, and logic circuitry. The logic circuitry can be arranged to provide an up signal or a down signal to control phase-locking of the reference clock signal and to track a falling edge of the reference clock signal and a falling edge of the received phase-locked loop feedback signal. The logic circuitry can adjust the up signal or the down signal in response to a phase difference between the reference clock signal and the received phase-locked loop feedback signal being greater than 180 degrees, detected from tracking the falling edge of the reference clock signal and the falling edge of the received phase-locked loop feedback signal.

Variations of such a system or similar systems can include a number of different embodiments that may be combined depending on the application of such phase-locked loop circuits or the architecture of devices or systems in which such phase-locked loop circuits are implemented. The logic circuitry can include at least four D flip-flops. The first one of the four D flip-flops can have an input to receive the reference clock signal. The second one of the four D flip-flops can have an input to receive an inverse of the reference clock signal. The third one of the four D flip-flops can have an input to receive the received phase-locked loop feedback signal. The fourth one of the four D flip-flops can have an input to receive an inverse of the received phase-locked loop feedback signal. The logic circuitry can include a set of logic gates coupled to outputs of the four D flip-flops to feed back signals to the four D flip-flops to control the up signal and the down signal.

Variations of such a system or similar systems can include the source node being a node of a reference clock signal generator of a host to a UFS platform and the phase-locked loop circuit can be disposed as part of the UFS platform. Variations can include the source node being an input pin to a memory system and the phase-locked loop circuit can be disposed as part of the memory system.

Figure 11:
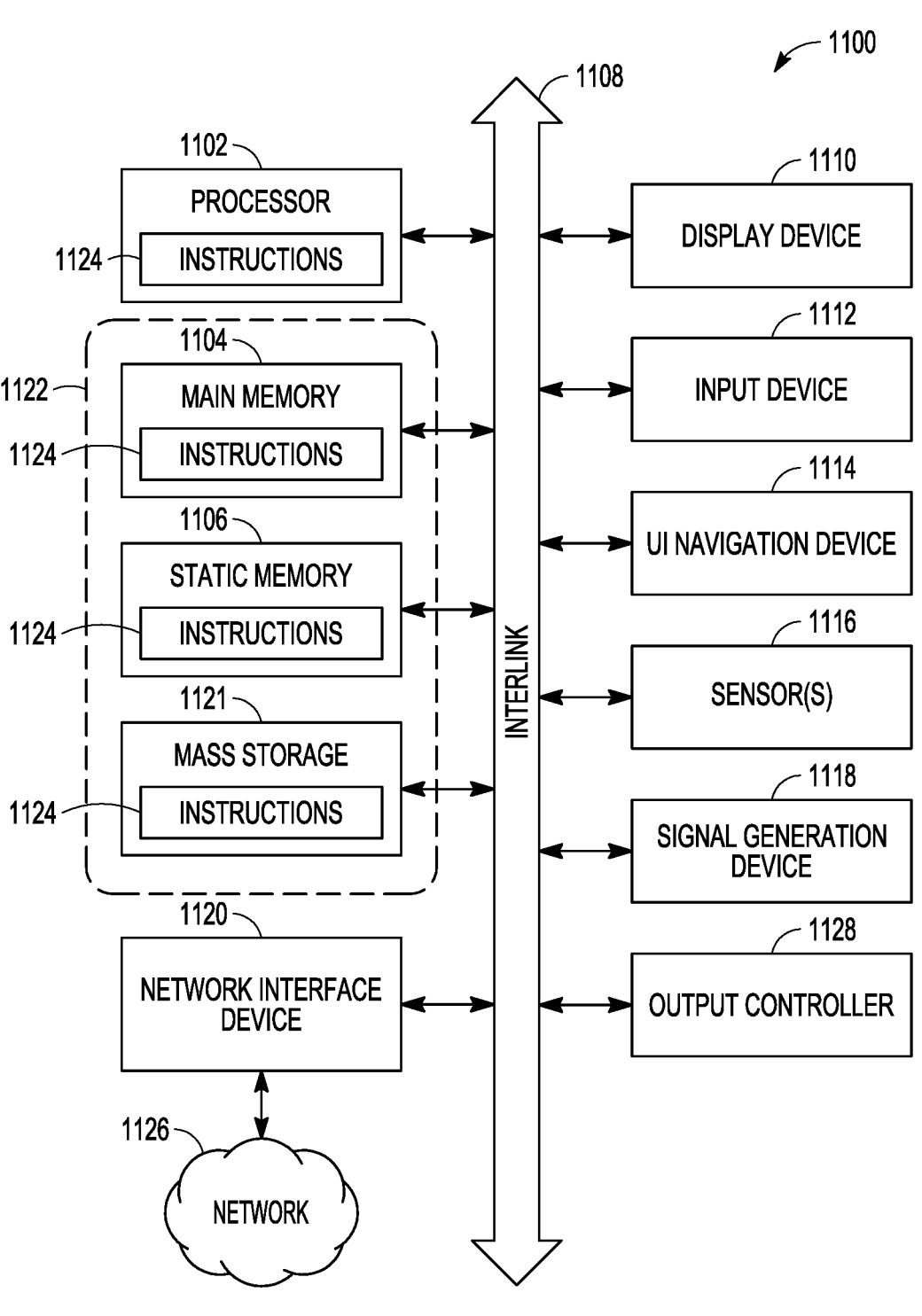
FIG. 11 is a block diagram illustrating an example of a machine upon which one or more embodiments may be implemented, according to various embodiments.

FIG. 11 is a block diagram of an embodiment of an example machine 1100 upon which any one or more of the techniques (e.g., methodologies) discussed herein may perform. In alternative embodiments, the machine 1100 may operate as a standalone device or may be connected (e.g., networked) to other machines. In a networked deployment, the machine 1100 may operate in the capacity of a server machine, a client machine, or both in server-client network environments. In an example, the machine 1100 may act as a peer machine in peer-to-peer (P2P) (or other distributed) network environment. The machine 1100 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies, such as cloud computing, software as a service (SaaS), other computer cluster configurations. The example machine 1100 can be arranged to operate in the environment 100 of FIG. 1. The example machine 1100 can include a memory system or one or more memory devices having structures including one or more PFDs as discussed herein and with respect to the memory system 110 of FIG. 1, memory array 200 of FIG. 2, the memory array 300 of FIG. 3, and the memory device 400 of FIG. 4.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 1100, such as but not limited to a computer system or a system including for example the host device 105, the memory system 110, etc. of FIG. 1, can include a processor 1102, which can be a hardware processor such as, for example, a CPU, a GPU, a hardware processor core, or any combination thereof, such as the memory processing device 115, etc. The machine 1100 can include a main memory 1104 and a static memory 1106, some or all of which may communicate with each other via an interlink (e.g., bus) 1108. The machine 1100 can further include a display device 1110, an alphanumeric input device 1112 (e.g., a keyboard), and a user interface (UI)

navigation device 1114 (e.g., a mouse). In an example, the display device 1110, input device 1112, and UI navigation device 1114 may be a touch screen display. The machine 1100 may additionally include a mass storage (e.g., drive unit) 1121, a signal generation device 1118 (e.g., a speaker), a network interface device 1120, and one or more sensors 1116, such as a global positioning system (GPS) sensor, compass, accelerometer, or other sensor. The machine 1100 may include an output controller 1128, such as a serial (e.g., USB, parallel, or other wired or wireless (e.g., infrared (IR), near field communication (NFC), etc.) connection to communicate or control one or more peripheral devices (e.g., a printer, card reader, etc.).

The machine 1100 may include a machine-readable medium 1122 on which is stored one or more sets of data structures or instructions 1124 (e.g., software) embodying or utilized by any one or more of the techniques or functions described herein. The instructions 1124 may also reside, completely or at least partially, within the main memory 1104, within the static memory 1106, within the mass storage 1121, or within the processor 1102 during execution thereof by the machine 1100. One or more of the machine-readable medium 1122, the main memory 1104, the static memory 1106, and the mass storage 1121 can include a PLL circuit having a PFD as taught herein. In an example, one or any combination of the processor 1102, the main memory 1104, the static memory 1106, or the mass storage 1121 may constitute the machine-readable medium 1122.

While the machine-readable medium 1122 is illustrated as a single medium, the term "machine-readable medium" may include a single medium or multiple media (e.g., a centralized or distributed database, or associated caches and servers) configured to store the one or more instructions 1124.

The term "machine-readable medium" may include any medium that is capable of storing, encoding, or carrying instructions for execution by the machine 1100 and that cause the machine 1100 to perform any one or more of the techniques of the present disclosure, or that is capable of storing, encoding or carrying data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include non-volatile memory, such as semiconductor memory devices (e.g., EPROM, EEPROM) and flash memory devices; magnetic disks, such as internal hard disks and removable disks; magneto-optical disks: and compact disc-ROM (CD-ROM) and digital versatile disc-ROM (DVD-ROM) disks.

The instructions 1124 (e.g., software, programs, an operating system (OS), etc.) or other data are stored on the mass storage 1121, can be accessed by the memory 1104 for use by the processor 1102. The memory 1104 (e.g., DRAM) is typically fast, but volatile, and thus a different type of storage than the mass storage 1121 (e.g., an SSD), which is suitable for long-term storage, including while in an "off" condition. The instructions 1124 or data in use by a user or the machine 1100 are typically loaded in the memory 1104 for use by the processor 1102. When the memory 1104 is full, virtual space from the mass storage 1121 can be allocated to supplement the memory 1104; however, because the mass storage 1121 is typically slower than the memory 1104, and write speeds are typically at least twice as slow as read speeds, use of virtual memory can greatly reduce user experience due to storage device latency (in contrast to the memory 1104, e.g., DRAM). Further, use of the mass storage 1121 for virtual memory can greatly reduce the usable lifespan of the mass storage 1121.

In contrast to virtual memory, virtual memory compression (e.g., the Linux® kernel feature "ZRAM") uses part of the memory as compressed block storage to avoid paging to the mass storage 1121. Paging takes place in the compressed block until it is appropriate to write such data to the mass storage 1121. Virtual memory compression increases the usable size of memory 1104, while reducing wear on the mass storage 1121.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, eMMC™ devices are attached to a circuit board and considered a component of the host device, with read speeds that rival SATA based SSD devices. However, demand for mobile device performance continues to increase, such as to fully enable virtual or augmented-reality devices, utilize increasing networks speeds, etc. In response to this demand, storage devices have shifted from parallel to serial communication interfaces. UFS devices, including controllers and firmware, communicate with a host device using a low-voltage differential signaling (LVDS) serial interface with dedicated read/write paths, further advancing greater read/write speeds.

The instructions 1124 may further be transmitted or received over a communications network 1126 using a transmission medium via the network interface device 1120 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1120 may include one or more physical jacks (e.g., Ethernet, coaxial, or phone jacks) or one or more antennas to connect to the communications network 1126. In an example, the network interface device 1120 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible medium that is capable of storing, encoding, or carrying instructions for execution by the machine 1100, and includes instrumentalities to propagate digital or analog communications signals or other tangible medium to facilitate communication of such software.

The following are example embodiments of devices and methods, in accordance with the teachings herein. An example phase frequency detector 1 can comprise: a first input node to receive a reference clock signal; a second input node to receive an input signal; logic circuitry arranged to track a falling edge of the reference clock signal and a falling edge of the input signal; an up-output node to provide an up signal from the phase frequency detector; and a down-output node to provide a down signal from the phase frequency detector, with adjustment of the up signal or the down signal by the logic circuitry being responsive to a phase difference between the reference clock signal and the input signal being greater than 180 degrees detected from tracking the falling edge of the reference clock signal and the falling edge of the input signal.

An example phase frequency detector 2 can include features of example phase frequency detector 1 and can include the logic circuitry including: a first D flip-flop to receive the reference clock signal, the first D flip-flop having a reset input responsive to the down signal; and a second D flip-flop to receive the input signal, the second D flip-flop having a reset input responsive to the up signal.

An example phase frequency detector 3 can include features of example phase frequency detector 2 and any of the preceding example phase frequency detectors and can include the logic circuitry including: a third D flip-flop to receive a complement of the reference clock signal, the third D flip-flop having a reset input responsive to the down signal; and a fourth D flip-flop to receive a complement of the input signal, the fourth D flip-flop having a reset input responsive to the up signal.

An example phase frequency detector 4 can include features of example phase frequency detector 3 and any of the preceding example phase frequency detectors and can include the logic circuitry including: a first NAND gate having an input coupled to a main output of the third D flip-flop and another input coupled to a complementary output of the second D flip-flop; a second NAND gate having an input coupled to a main output of the fourth D flip-flop and another input coupled to a complementary output of the first D flip-flop: a third NAND gate having an input coupled to the up-output node and another input coupled to the down-output node; a first AND gate having an input coupled to an output of the first NAND gate and another input coupled to an output of the third NAND gate, with an output of the first AND gate arranged to provide a first signal to the reset input of the first D flip-flop; and a second AND gate having an input coupled to an output of the second NAND gate and another input coupled to the output of the third NAND gate, with an output of the second AND gate arranged to provide a second signal to the reset input of the second D flip-flop.

An example phase frequency detector 5 can include features of example phase frequency detector 4 and any of the preceding example phase frequency detectors and can include the logic circuitry including: a first delay device having an input coupled to an output of the first AND gate and having an output coupled to the reset input of the first D flip-flop and to a reset input of the third D flip-flop: and a second delay device having an input coupled to an output of the second AND gate and having an output coupled to the reset input of the second D flip-flop and a reset input of the fourth D flip-flop.

An example phase frequency detector 6 can include features of example phase frequency detector 5 and any of the preceding example phase frequency detectors and can include the logic circuitry including a data node coupled to a data input of the first D flip-flop, a data input of the second D flip-flop, a data input of the third D flip-flop, and a data input of the fourth D flip-flop.

In an example phase frequency detector 7, any of the phase frequency detectors of example phase frequency detectors 1 to 6 may be operable with memory devices associated with example systems comprising a host processor and a communication bus extending between the host processor and the memory device.

In an example phase frequency detector 8, any of the phase frequency detectors of example phase frequency detectors 1 to 7 may be modified to include any structure presented in another example phase frequency detector of example phase frequency detectors 1 to 7.

In an example phase frequency detector 9, any apparatus associated with the example phase frequency detector of example phase frequency detectors 1 to 8 may further include a machine-readable storage device configured to store instructions as a physical state, wherein the instructions may be used to perform one or more operations of the apparatus.

In an example phase frequency detector 10, any of the phase frequency detectors of example phase frequency detectors 1 to 9 may be adapted and operated to perform operations in accordance with any of the methods of the following example methods 1-5.

An example phase-locked loop circuit 1 can comprise: a voltage-controlled oscillator having an input and an output; a charge pump having an up-signal input, a down-signal input, and an output coupled to the input of the voltage-controlled oscillator: and a phase frequency detector including: a first input node to receive a reference clock signal: a second input node coupled to the output of the voltage-controlled oscillator to receive a phase-locked loop feedback signal; logic circuitry arranged to track a falling edge of the reference clock signal and a falling edge of the received phase-locked loop feedback signal; an up-output node to provide an up signal to the up signal input of the charge pump; and a down-output node to provide a down signal to the down-signal input of the charge pump, with adjustment of the down signal by the logic circuitry being responsive to a phase difference between the reference clock signal and the received phase-locked loop feedback signal being greater than 180 degrees detected from tracking the falling edge of the reference clock signal and the falling edge of the received phase-locked loop feedback signal.

An example phase-locked loop circuit 2 can include features of example phase-locked loop circuit 1 and can include the logic circuitry including: a first D flip-flop to receive the reference clock signal, the first D flip-flop having a reset input responsive to the down signal; and a second D flip-flop to receive the received phase-locked loop feedback signal, the second D flip-flop having a reset input responsive to the up signal.

An example phase-locked loop circuit 3 can include features of any of the preceding example phase-locked loop circuits and can include a programmable divider coupled to the output of the voltage of the voltage-controlled oscillator and to the second input node of the phase frequency detector.

An example phase-locked loop circuit 4 can include features of any of the preceding example phase-locked loop circuits and can include the logic circuitry including four D flip-flops with a first one of the four D flip-flops having an input to receive the reference clock signal, a second one of the four D flip-flops having an input to receive an inverse of the reference clock signal, a third one of the four D flip-flops having an input to receive the received phase-locked loop feedback signal, and a fourth one of the four D flip-flops having an input to receive an inverse of the received phase-locked loop feedback signal.

An example phase-locked loop circuit 5 can include features of example phase-locked loop circuit 4 and any of the preceding example phase-locked loop circuits and can include the logic circuitry including a set of logic gates coupled to outputs of the four D flip-flops to feed back signals to the four D flip-flops to control the up signal and the down signal.

In an example phase-locked loop circuit 6, any of the phase-locked loop circuits of example phase-locked loop circuits 1 to 5 may include phase-locked loop circuits incorporated into an electronic phase-locked loop circuit further comprising a host processor and a communication bus extending between the host processor and the phase-locked loop circuit.

In an example phase-locked loop circuit 7, any of the phase-locked loop circuits of example phase-locked loop circuits 1 to 6 may be modified to include any structure presented in another example phase-locked loop circuit of example phase-locked loop circuits 1 to 6.

In an example phase-locked loop circuit 8, any of apparatus of any of the phase-locked loop circuits of example phase-locked loop circuits 1 to 7 may further include a machine-readable storage device configured to store instructions as a physical state, wherein the instructions may be used to perform one or more operations of the apparatus.

In an example phase-locked loop circuit 9, any of the phase-locked loop circuits of example phase-locked loop circuits 1 to 8 may be adapted and operated to perform operations in accordance with any of the methods of the following example methods 1-5.

An example system 1 can comprise: a source node to provide a reference clock signal; and a phase-locked loop circuit coupled to receive the reference clock signal, the phase-locked loop circuit having: a phase frequency detector, the phase frequency detector including: a first input node to receive the reference clock signal; a second input node coupled to receive a phase-locked loop feedback signal; and logic circuitry arranged to provide an up signal or a down signal to control phase-locking of the reference clock signal and to track a falling edge of the reference clock signal and a falling edge of the received phase-locked loop feedback signal, with adjustment of the up signal or the down signal by the logic circuitry being responsive to a phase difference between the reference clock signal and the received phase-locked loop feedback signal being greater than 180 degrees detected from tracking the falling edge of the reference clock signal and the falling edge of the received phase-locked loop feedback signal: and an output node to provide a phase-locked version of the received reference clock signal.

An example system 2 can include features of example system 1 and can include the logic circuitry including: four D flip-flops with a first one of the four D flip-flops having an input to receive the reference clock signal, a second one of the four D flip-flops having an input to receive an inverse of the reference clock signal, a third one of the four D flip-flops having an input to receive the received phase-locked loop feedback signal, and a fourth one of the four D flip-flops having an input to receive an inverse of the received phase-locked loop feedback signal: and a set of logic gates coupled to outputs of the four D flip-flops to feed back signals to the four D flip-flops to control the up signal and the down signal.

An example system 3 can include features of any of the preceding example systems and can include the source node being a node of a reference clock signal generator of a host to a Universal Flash Storage (UFS) platform and the phase-locked loop circuit being disposed as part of the UFS platform.

An example system 4 can include features of any of the preceding example systems and can include the source node being an input pin to a memory system and the phase-locked loop circuit being disposed as part of the memory system.

In an example system 5, any of the systems of example systems 1 to 4 may be modified to include any structure presented in another example system of example systems 1 to 4.

In an example system 6, any of apparatus of any of the systems of example systems 1 to 5 may further include a machine-readable storage device configured to store instructions as a physical state, wherein the instructions may be used to perform one or more operations of the apparatus.

In an example system 7, any of the systems of example systems 1 to 6 may be adapted and operated to perform operations in accordance with any of the methods of the following example methods 1-5.

An example method 1 of controlling a reference clock signal can comprise: receiving the reference clock signal at a first input node of a phase frequency detector of a phase-locked loop circuit; receiving a phase-locked loop feedback signal at a second input node of the phase frequency detector; providing, in the phase frequency detector, an up signal or a down signal to control phase-locking of the reference clock signal; tracking, in the phase frequency detector, a falling edge of the reference clock signal and a falling edge of the phase-locked loop feedback signal: and adjusting, in the phase frequency detector, the up signal or the down signal in response to detecting, from the tracking, a phase difference between the reference clock signal and the phase-locked loop feedback signal being greater than 180 degrees.

An example method 2 of controlling a reference clock signal can include features of example method 1 of controlling a reference clock signal and can include the tracking to include: checking the falling edge of the reference clock signal with the down signal to decide, using a first set of logic gates, to reset a D-flip-flop receiving the reference clock signal; and checking the falling edge of the phase-locked loop feedback signal with the up signal to decide, using a second set of logic gates, to reset a D-flip-flop receiving the phase-locked loop feedback signal.

An example method 3 of controlling a reference clock signal can include features of any of the preceding example methods of controlling a reference clock signal and can include using the up signal to control the phase-locking for the phase difference being less than 180 degrees and using the down signal to control the phase-locking for the phase difference being greater than 180 degrees.

An example method 4 of controlling a reference clock signal can include features of any of the preceding example methods of controlling a reference clock signal and can include supporting the reference clock signal matching a higher system clock using a programmable frequency divider coupled between an output of the phase-locked loop circuit and the second input node of the phase frequency detector.

An example method 5 of controlling a reference clock signal can include features of any of the preceding example methods of controlling a reference clock signal and can include the phase-locked loop circuit being disposed in a controller of a memory system.

In an example method 6 of controlling a reference clock signal, any of the example methods 1-5 of controlling a reference clock signal may be performed by an electronic system including a host processor and a communications interface extending between the host processor and a memory device.

In an example method 7 of controlling a reference clock signal, any of the example methods 1-6 of controlling a reference clock signal may be modified to include operations set forth in any other of method examples 1-6 of controlling a reference clock signal.

In an example method 8 of controlling a reference clock signal, any of the example methods 1-7 of controlling a reference clock signal may be implemented at least in part through use of instructions stored as a physical state in one or more machine-readable storage devices.

An example method 9 of controlling a reference clock signal can include features of any of the preceding example methods 1-8 of controlling a reference clock signal and can include performing functions associated with any features of example phase frequency detectors 1 to 10, example phase-locked loop circuits 1 to 9, and example systems 1-7.

An example machine-readable storage device 1 storing instructions, that when executed by one or more processors, cause a machine to perform operations, can comprise instructions to perform functions associated with any features of example phase frequency detectors 1 to 10, example phase-locked loop circuits 1 to 9, and example systems 1-7 or perform methods associated with any features of example methods 1-9.

In various examples, the components, controllers, processors, units, engines, or tables described herein can include, among other things, physical circuitry or firmware stored on a physical device. As used herein, "processor device" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer-readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, RAMs, ROMs, SSDs, UFS devices, eMMC devices, and the like.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. The above description is intended to be illustrative, and not restrictive, and that the phraseology or terminology employed herein is for the purpose of description. In addition, in the foregoing Detailed Description, it can be seen that various features are grouped together in a single embodiment for the purpose of streamlining the disclosure. Combinations of the above embodiments and other embodiments will be apparent to those of skill in the art upon studying the above description.

What is claimed is:

1. A phase frequency detector comprising:
a first input node to receive a reference clock signal;
a second input node to receive an input signal;
logic circuitry arranged to track a falling edge of the reference clock signal and a falling edge of the input signal;
an up-output node to provide an up signal from the phase frequency detector;
a down-output node to provide a down signal from the phase frequency detector, with adjustment of the up signal or the down signal by the logic circuitry being responsive to a phase difference between the reference clock signal and the input signal being greater than 180 degrees detected from tracking the falling edge of the reference clock signal and the falling edge of the input signal;
a first D flip-flop to receive the reference clock signal, the first D flip-flop having an output directly coupled to the up-output node; and
a second D flip-flop to receive the input signal, the second D flip-flop directly coupled to the down-output node.

2. The phase frequency detector of claim 1, wherein the logic circuitry includes:
the first D flip-flop having a reset input responsive to the down signal; and
the second D flip-flop having a reset input responsive to the up signal.

3. The phase frequency detector of claim 2, wherein the logic circuitry includes:
a third D flip-flop to receive a complement of the reference clock signal, the third D flip-flop having a reset input responsive to the down signal; and
a fourth D flip-flop to receive a complement of the input signal, the fourth D flip-flop having a reset input responsive to the up signal.

4. A phase frequency detector comprising:
a first input node to receive a reference clock signal;
a second input node to receive an input signal;
logic circuitry arranged to track a falling edge of the reference clock signal and a falling edge of the input signal;
an up-output node to provide an up signal from the phase frequency detector; and
a down-output node to provide a down signal from the phase frequency detector, with adjustment of the up signal or the down signal by the logic circuitry being responsive to a phase difference between the reference clock signal and the input signal being greater than 180 degrees detected from tracking the falling edge of the reference clock signal and the falling edge of the input signal, wherein the logic circuitry includes:
a first D flip-flop to receive the reference clock signal, the first D flip-flop having a reset input responsive to the down signal;
a second D flip-flop to receive the input signal, the second D flip-flop having a reset input responsive to the up signal;

a third D flip-flop to receive a complement of the reference clock signal, the third D flip-flop having a reset input responsive to the down signal;

a fourth D flip-flop to receive a complement of the input signal, the fourth D flip-flop having a reset input responsive to the up signal;

a first NAND gate having an input coupled to a main output of the third D flip-flop and another input coupled to a complementary output of the second D flip-flop;

a second NAND gate having an input coupled to a main output of the fourth D flip-flop and another input coupled to a complementary output of the first D flip-flop;

a third NAND gate having an input coupled to the up-output node and another input coupled to the down-output node;

a first AND gate having an input coupled to an output of the first NAND gate and another input coupled to an output of the third NAND gate, with an output of the first AND gate arranged to provide a first signal to the reset input of the first D flip-flop; and a second AND gate having an input coupled to an output of the second NAND gate and another input coupled to the output of the third NAND gate, with an output of the second AND gate arranged to provide a second signal to the reset input of the second D flip-flop.

5. The phase frequency detector of claim 4, wherein the logic circuitry includes:

a first delay device having an input coupled to an output of the first AND gate and having an output coupled to the reset input of the first D flip-flop and to a reset input of the third D flip-flop; and a second delay device having an input coupled to an output of the second AND gate and having an output coupled to the reset input of the second D flip-flop and a reset input of the fourth D flip-flop.

6. The phase frequency detector of claim 5, wherein the logic circuitry includes a data node coupled to a data input of the first D flip-flop, a data input of the second D flip-flop, a data input of the third D flip-flop, and a data input of the fourth D flip-flop.

7. A phase-locked loop circuit comprising:

a voltage-controlled oscillator having an input and an output;

a charge pump having an up-signal input, a down-signal input, and an output coupled to the input of the voltage-controlled oscillator; and a phase frequency detector including:

a first input node to receive a reference clock signal;

a second input node coupled to the output of the voltage-controlled oscillator to receive a phase-locked loop feedback signal;

logic circuitry arranged to track a falling edge of the reference clock signal and a falling edge of the received phase-locked loop feedback signal;

an up-output node to provide an up signal to the up-signal input of the charge pump;

a down-output node to provide a down signal to the down signal input of the charge pump, with adjustment of the down signal by the logic circuitry being responsive to a phase difference between the reference clock signal and the received phase-locked loop feedback signal being greater than 180 degrees detected from tracking the falling edge of the reference clock signal and the falling edge of the received phase-locked loop feedback signal;

a first D flip-flop to receive the reference clock signal, the first D flip-flop having an output directly coupled to the up-output node; and a second D flip-flop to receive the received phase-locked loop feedback signal, the second D flip-flop directly coupled to the down-output node.

8. The phase-locked loop circuit of claim 7, wherein the logic circuitry includes:

the first D flip-flop having a reset input responsive to the down signal; and the second D flip-flop having a reset input responsive to the up signal.

9. The phase-locked loop circuit of claim 7, wherein the phase-locked loop circuit includes a programmable divider coupled to the output of the voltage of the voltage-controlled oscillator and to the second input node of the phase frequency detector.

10. The phase-locked loop circuit of claim 7, wherein the logic circuitry includes four D flip-flops including the first D flip-flop, the second D flip-flop, a third D flip-flop having an input to receive an inverse of the reference clock signal, and a fourth D flip-flop having an input to receive an inverse of the received phase-locked loop feedback signal.

11. The phase-locked loop circuit of claim 10, wherein the logic circuitry includes a set of logic gates coupled to outputs of the four D flip-flops to feed back signals to the four D flip-flops to control the up signal and the down signal.

12. A system comprising:

a source node to provide a reference clock signal; and a phase-locked loop circuit coupled to receive the reference clock signal, the phase-locked loop circuit having:

a phase frequency detector, the phase frequency detector including:

a first input node to receive the reference clock signal;

a second input node to receive a phase-locked loop feedback signal;

logic circuitry arranged to provide an up signal or a down signal to control phase-locking of the reference clock signal and to track a falling edge of the reference clock signal and a falling edge of the received phase-locked loop feedback signal, with adjustment of the up signal or the down signal by the logic circuitry being responsive to a phase difference between the reference clock signal and the received phase-locked loop feedback signal being greater than 180 degrees detected from tracking the falling edge of the reference clock signal and the falling edge of the received phase-locked loop feedback signal;

a first D flip-flop to receive the reference clock signal, the first D flip-flop having an output directly coupled to the up-output node; and a second D flip-flop to receive the received phase-locked loop feedback signal, the second D flip-flop directly coupled to the down-output node; and an output node to provide a phase-locked version of the received reference clock signal.

13. The system of claim 12, wherein the logic circuitry includes:

four D flip-flops including the first D flip-flop, the second D flip-flop, a third D flip-flop having an input to receive an inverse of the reference clock signal, and a fourth D flip-flop having an input to receive an inverse of the received phase-locked loop feedback signal; and a set of logic gates coupled to outputs of the four D flip-flops to feed back signals to the four D flip-flops to control the up signal and the down signal.

14. The system of claim 12, wherein the source node is a node of a reference clock signal generator of a host to a Universal Flash Storage (UFS) platform and the phase-locked loop circuit is disposed as part of the UFS platform.

15. The system of claim 12, wherein the source node is an input pin to a memory system and the phase-locked loop circuit is disposed as part of the memory system.

16. A method of controlling a reference clock signal, the method comprising:

receiving the reference clock signal at a first input node to a first D flip-flop of a phase frequency detector of a phase-locked loop circuit, the first D flip-flop having an output directly coupled to an up-output node of the phase frequency detector;

receiving a phase-locked loop feedback signal at a second input node to a second D flip-flop of the phase frequency detector, the second D flip-flop having an output directly coupled to a down-output node of the phase frequency detector;

providing, in the phase frequency detector, an up signal or a down signal to control phase-locking of the reference clock signal;

tracking, in the phase frequency detector, a falling edge of the reference clock signal and a falling edge of the phase-locked loop feedback signal; and adjusting, in the phase frequency detector, the up signal or the down signal in response to detecting, from the tracking, a phase difference between the reference clock signal and the phase-locked loop feedback signal being greater than 180 degrees.

17. The method of claim 16, wherein the tracking includes:

checking the falling edge of the reference clock signal with the down signal to decide, using a first set of logic gates, to reset the D-flip-flop receiving the reference clock signal; and checking the falling edge of the phase-locked loop feedback signal with the up signal to decide, using a second set of logic gates, to reset the D-flip-flop receiving the phase-locked loop feedback signal.

18. The method of claim 16, wherein the method includes using the up signal to control the phase-locking for the phase difference being less than 180 degrees and using the down signal to control the phase-locking for the phase difference being greater than 180 degrees.

19. The method of claim 16, wherein the method includes supporting the reference clock signal matching a higher system clock using a programmable frequency divider coupled between an output of the phase-locked loop circuit and the second input node of the phase frequency detector.

20. The method of claim 16, wherein the phase-locked loop circuit is disposed in a controller of a memory system.

* * * * *